(12) United States Patent
Zhang et al.

(10) Patent No.: US 12,087,371 B2
(45) Date of Patent: Sep. 10, 2024

(54) PREVENTING ERASE DISTURB IN NAND

(71) Applicant: SanDisk Technologies LLC, Addison, TX (US)

(72) Inventors: Yanli Zhang, San Jose, CA (US); James K. Kai, Santa Clara, CA (US); Johann Alsmeier, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 244 days.

(21) Appl. No.: 17/954,937

(22) Filed: Sep. 28, 2022

(65) Prior Publication Data
US 2024/0105271 A1 Mar. 28, 2024

(51) Int. Cl.
| | |
|---|---|
| G11C 16/04 | (2006.01) |
| G11C 16/08 | (2006.01) |
| G11C 16/14 | (2006.01) |
| G11C 16/24 | (2006.01) |
| G11C 16/34 | (2006.01) |
| H01L 25/065 | (2023.01) |

(52) U.S. Cl.
CPC ...... *G11C 16/3427* (2013.01); *G11C 16/0483* (2013.01); *G11C 16/08* (2013.01); *G11C 16/14* (2013.01); *G11C 16/24* (2013.01); *G11C 16/3445* (2013.01); *H01L 25/0657* (2013.01); *H01L 2225/06562* (2013.01)

(58) Field of Classification Search
CPC .................................................. G11C 16/3427
USPC .................................................... 365/185.02
See application file for complete search history.

(56) References Cited

U.S. PATENT DOCUMENTS

| | | | |
|---|---|---|---|
| 7,170,783 B2 | 1/2007 | Ha et al. | |
| 7,830,724 B2 | 11/2010 | Park et al. | |
| 8,488,382 B1 | 7/2013 | Li et al. | |
| 9,460,799 B1 * | 10/2016 | Costa | G11C 29/52 |
| 9,881,685 B2 | 1/2018 | Yoon et al. | |
| 10,354,737 B2 | 7/2019 | Hu | |
| 2006/0114737 A1 * | 6/2006 | Terasawa | G11C 16/0466 365/227 |
| 2020/0388335 A1 * | 12/2020 | Chibvongodze | G11C 16/24 |

* cited by examiner

*Primary Examiner* — Hoai V Ho
(74) *Attorney, Agent, or Firm* — Vierra Magen Marcus LLP

(57) ABSTRACT

Technology is disclosed herein for preventing erase disturb in NAND. Erase voltages are applied to a source line and bit lines associated with selected memory cells, while applying an erase enable voltage to word lines connected to the selected cells. Preventing erase disturb may include raising the channel potential of unselected memory cells to a source line voltage that has a sufficiently low magnitude to not erase the unselected cells given a voltage on word lines connected to the unselected cells. The unselected cells share bit lines with the selected cells and may also share word lines. Preventing erase disturb may also include applying voltages to the select transistors that prevent the erase voltage from passing from the shared bit lines to the channels of the unselected cells. The voltages decrease from the bit lines to the unselected memory cells and may prevent GIDL generation. Current consumption is kept low.

20 Claims, 23 Drawing Sheets

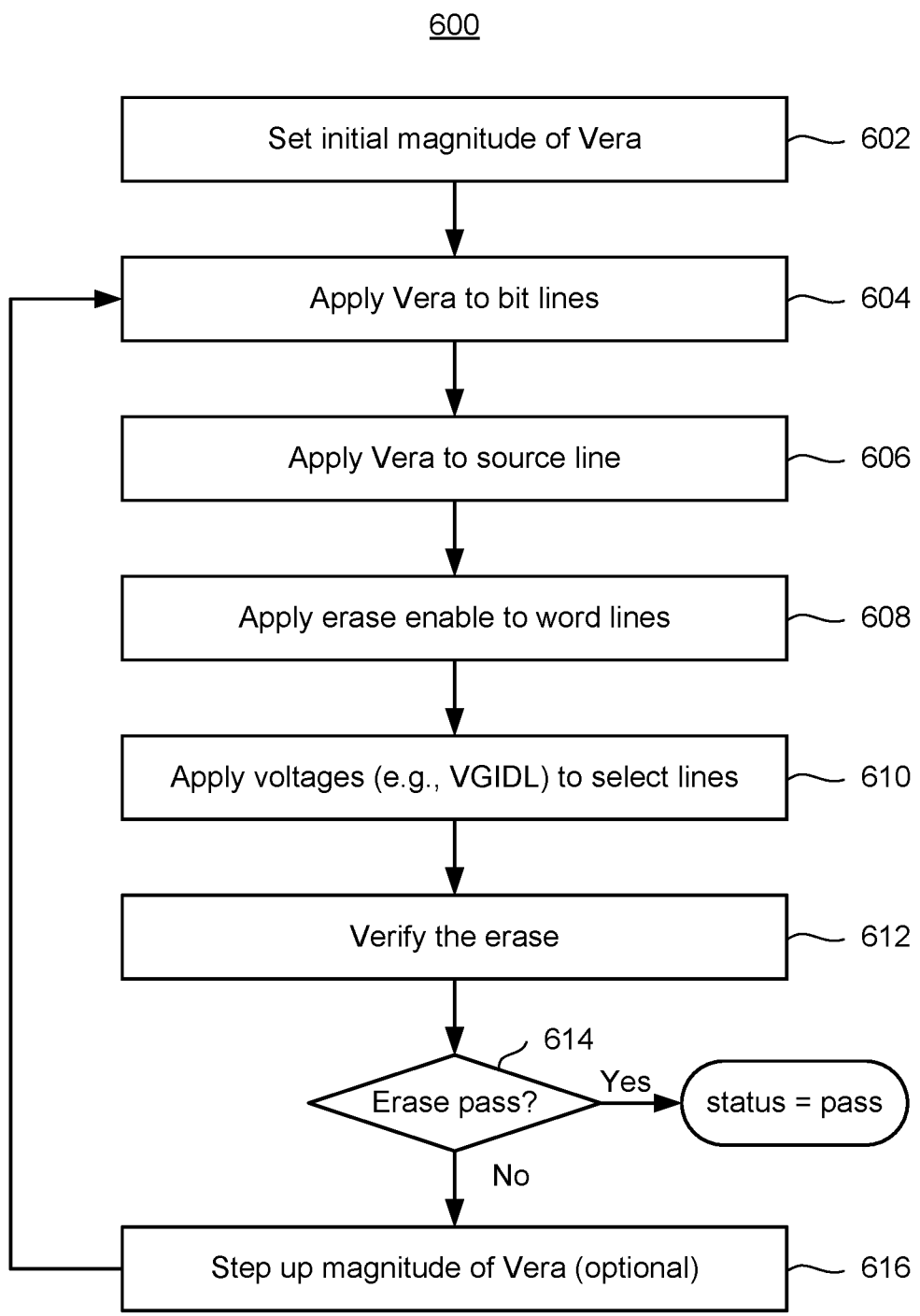

800

900

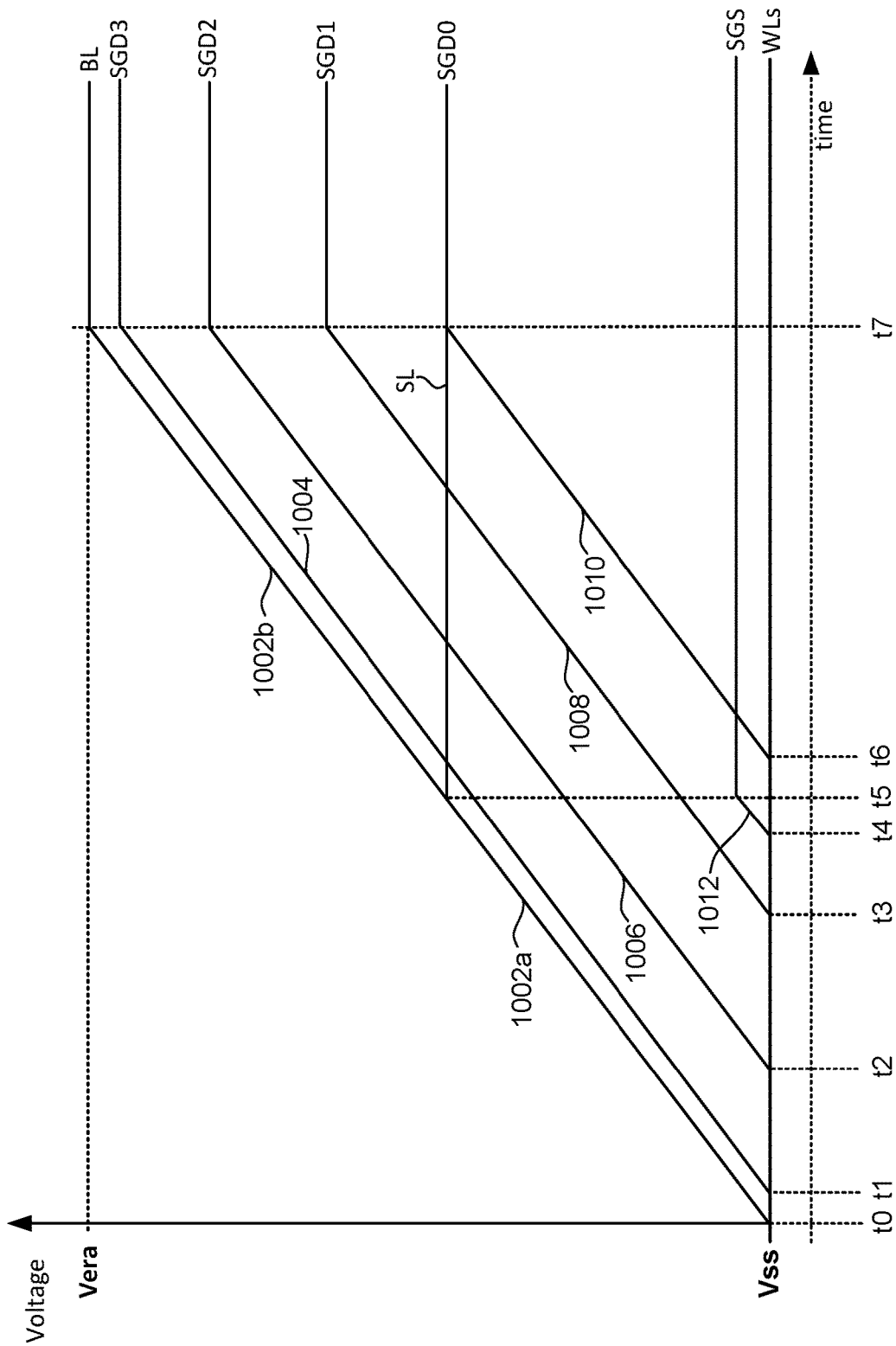

- 1102: Apply the first voltage that is lower than the first erase voltage to source line in an unselected block (e.g., block n-2) that shares a source line with the unselected block (e.g., block n-1) that shares word lines with the selected block
- 1104: Apply a GIDL voltage to source side select gates in unselected block n-2 to pass the first voltage from the source line to channels of unselected memory cells in unselected block n-2
- 1106: Apply voltage to word lines in unselected block n-2 that prevents erase given the channel potential

- 1202: Apply a second voltage that is lower than the first erase voltage to source line in an unselected block (e.g., block n-3) that shares word lines of the unselected block (e.g., block n-2) that is not adjacent to the selected block
- 1204: Apply a GIDL voltage to source side select gates in unselected block n-3 to pass the first voltage from the source line to channels of memory cells in unselected block n-3
- 1206: Apply voltage to word lines in unselected block n-3 that prevents erase given the channel potential

| Block # | N-6 | N-5 | N-4 | N-3 | N-2 | N-1 | N | N+1 | N+2 |
|---|---|---|---|---|---|---|---|---|---|
| SL | Vera | Vera | 2*Ve-Vod | 2*Ve-Vod | Ve | Ve | Vera | Vera | Float |
| SGS | Float | Vera | (2Ve-Vod)-Δ | (2Ve-Vod)-Δ | Ve-Δ | Ve-Δ | Vera-Δ | Float | Float |
| WL | Float | 2*Ve-2*Vod | 2*Ve-2*Vod | Ve-Vod | Ve-Vod | Vss | Vss | Float | Float |
| SGD gates | Float | Vera | Gradually decrease from BL to memory cells | | | | Vera-Δ | Float | Float |
| BL | Vera | Vera | Vera | Vera | Vera | Vera | Vera | Vera | Vera |

Shared SL / Shared WLs / Shared SL / Shared WLs / Shared SL / Shared WLs / Shared SL / Shared WLs

| Block # | N-4 | N-3 | N-2 | N-1 | N |
|---|---|---|---|---|---|
| SL | 18 | 18 | 11 | 11 | 23 |
| SGS | 8 | 8 | 1 | 1 | 13 |
| WL | 15 | 8 | 8 | 0 | 0 |
| SGD0 | 18 | 18 | 11 | 11 | 13 |
| SGD1 | 20 | 20 | 15 | 15 | 13 |
| SGD2 | 21 | 21 | 19 | 19 | 13 |
| SGD3 | 22 | 22 | 22 | 22 | 13 |
| BL | 23 | 23 | 23 | 23 | 23 |

PREVENTING ERASE DISTURB IN NAND

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has word lines that provide voltages to the control gates of the memory cell transistors. In some architectures, each word line connects to the control gate of one memory cell on each respective NAND string in the block. A portion of the word line that is adjacent to the memory cell may be considered to be the control gate of that cell.

The non-volatile memory cells may be programmed to store data. Typically, the memory cells are programmed to data states. Using two data states to store a single bit per cell is referred to herein as SLC programming. Using a greater number of data states allows for more bits to be stored per memory cell. Using additional data states to store two or more bits per cell is referred to herein as MLC programming. For example, four data states may be used to store two bits per memory cell, eight data states may be used in order to store three bits per memory cell, 16 data states may be used to store four bits per memory cell, etc. Some types of memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

Prior to programming NAND memory cells the memory cells are erased. Erasing the memory cells will typically lower the Vt of each memory cell that is not already below an erase verify reference voltage. Typically, many memory cells are erased at the same time. The term "erase block" or "erase group" may be used herein to refer to a group of NAND memory cells that share word lines and are erased together. However, note that not all of the memory cells that share the word lines are necessary in the erase group.

Erasing one group of memory cells can undesirably result in a small amount of erase to other memory cells, which is referred to as erase disturb.

BRIEF DESCRIPTION OF THE DRAWINGS

Like-numbered elements refer to common components in the different figures.

FIG. 6 is a flowchart describing one embodiment of a process for erasing memory cells.

FIG. 10 shows timing of voltages applied when performing an embodiment of preventing erase disturb in an unselected group that shares word lines with the memory cells being erased.

FIG. 11 is a flowchart of one embodiment of a process of raising the channel potential of memory cells in an unselected group that shares a source line with an unselected group that shares word lines with the selected group.

FIG. 12 is a flowchart of one embodiment of a process of raising the channel potential of memory cells in an unselected group that shares word lines with an unselected group that does not share word lines with the selected group.

FIG. 17 shows a table of pertaining to voltages of an embodiment of preventing erase disturb in NAND.

FIG. 18 provides example voltages for one embodiment of preventing erase disturb in NAND.

DETAILED DESCRIPTION

Figure 1:
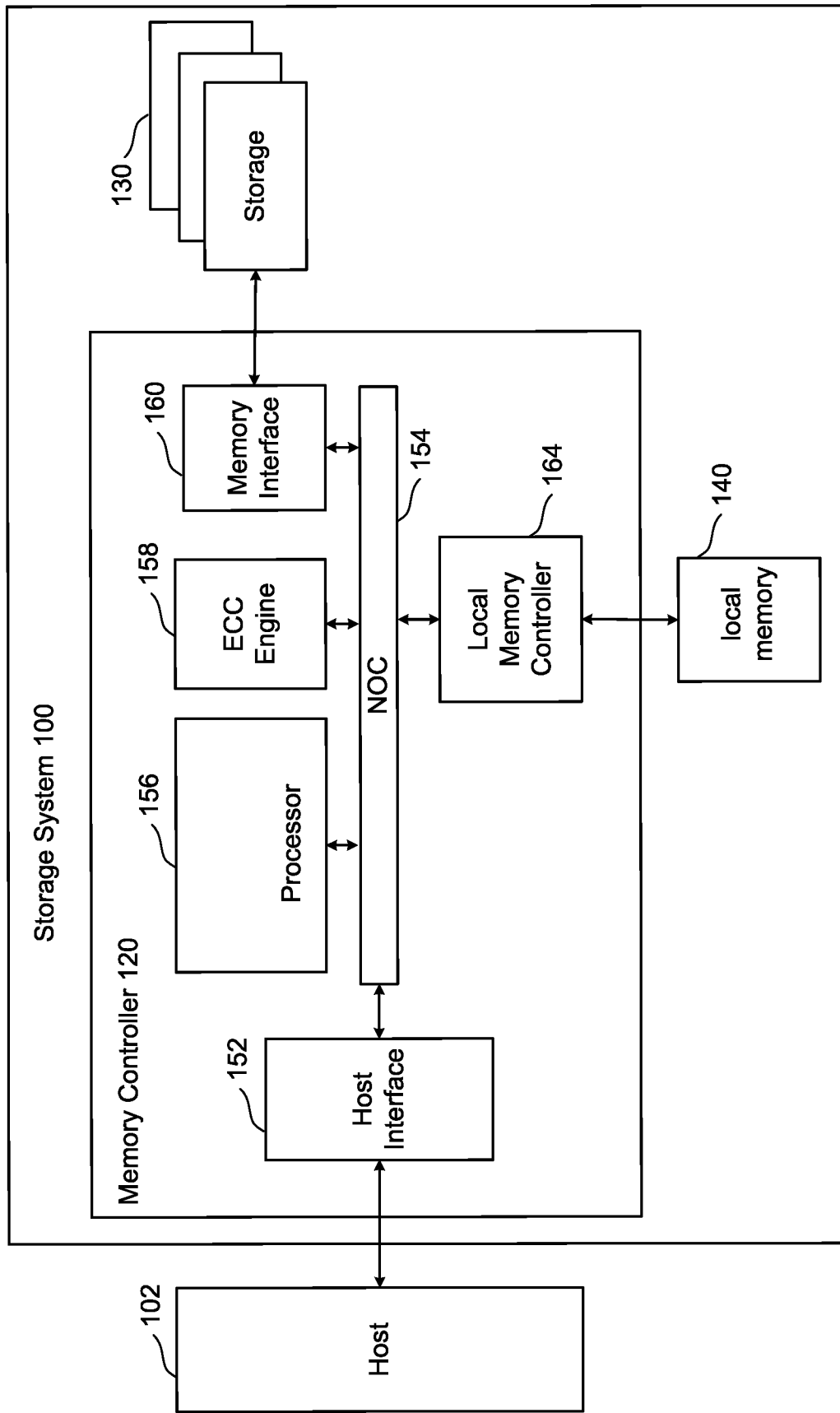
FIG. 1 is a block diagram depicting one embodiment of a storage system.

Technology is disclosed herein for preventing erase disturb when erasing NAND memory cells. Moreover, current consumption is kept low when preventing erase disturb. In an embodiment, erase disturb is prevented in an unselected erase group that shares bit lines with a selected erase group. Erasing memory cells in selected erase group may include applying an erase voltage to a source line associated with the selected erase group while applying the erase voltage to the bit lines and while applying an erase enable voltage to selected word lines of the selected erase group. Preventing erase disturb of the unselected erase group may include raising the potential of channels of memory cells in the unselected erase group to a voltage of the source line of the unselected erase group. The source line voltage has a sufficiently low magnitude to not erase the memory cells in the unselected erase group given a voltage on the word lines of the unselected erase group. In some cases, the unselected erase group and the selected erase group share word lines, in which case the voltage on the word lines of the unselected erase group will be the erase enable voltage. In other cases, the unselected erase group and the selected erase group do not share word lines, in which case the voltage on the word lines of the unselected erase group may be higher than the erase enable voltage in order to prevent erase in the unselected erase group. Inhibiting erase in the unselected erase group may also include applying a set of voltages to the select transistors of the drain side select gates in the unselected erase group that prevents the erase voltage from passing from the bit lines to the channels of the memory cells in the unselected erase group. In an embodiment, the voltages decrease in a direction from the bit lines to the memory cells in the unselected erase group. In an embodiment, the set of voltages range in magnitude between the erase voltage and the source line voltage (which is passed to the channels of memory cells in the unselected erase group). Therefore, gate-induced drain leakage (GIDL) current may be prevented at the drain side select gates. Moreover, current consumption may be kept low.

Herein the term "selected memory cell" means that the memory cell is to receive a memory operation such as erase, program, or read. The term "unselected memory cell" means that the memory cell is not to receive a memory operation such as erase, program, or read. Techniques are disclosed herein for erasing a group of selected memory cells while preventing (or inhibiting) erase in one or more unselected groups of memory cells. The term "selected" may also be used to refer to word lines, bit lines, NAND strings, and/or select lines to refer to word lines, bit lines, NAND strings, and/or select lines that are involved in a memory operation (e.g., erase) of one or more selected memory cells. For example, a "selected word line" is a word line that is connected to at least one selected memory cell. The selected word line could also be connected to one or more unselected memory cells. An "unselected word line" is not connected to any selected memory cell. Similarly, a "selected NAND string" is a NAND string that has a selected memory cell. The selected NAND string will typically also contain many memory cells that are not selected. An "unselected NAND string" does not have any selected memory cells. A selected bit line is connected to a selected NAND string containing a selected memory cell. A single bit line is typically associated with many NAND strings. Typically, a selected bit line is associated with one selected NAND string and many unselected NAND strings. An "unselected bit line" is not connected to any selected NAND strings.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
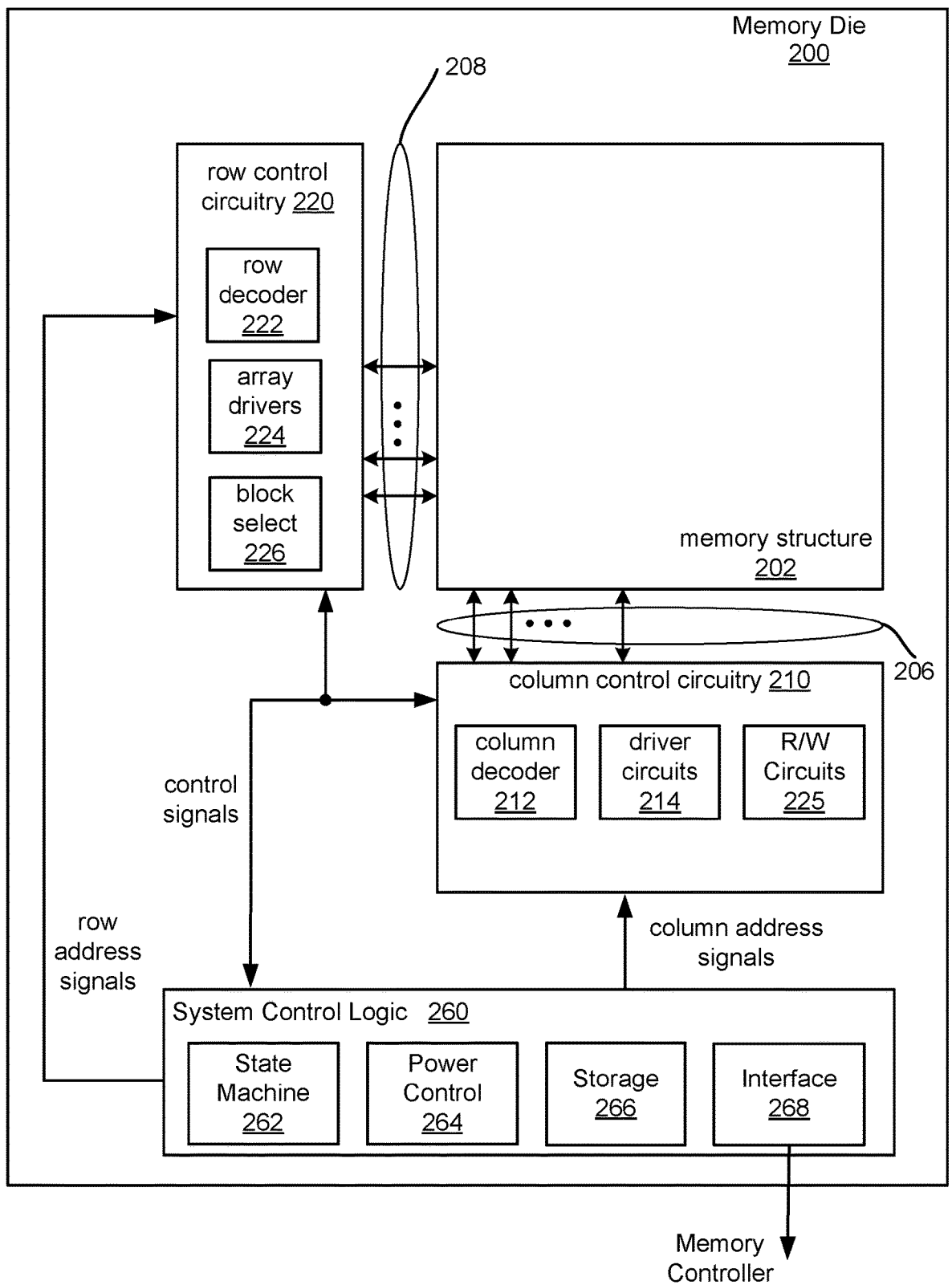
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of current, voltage, light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
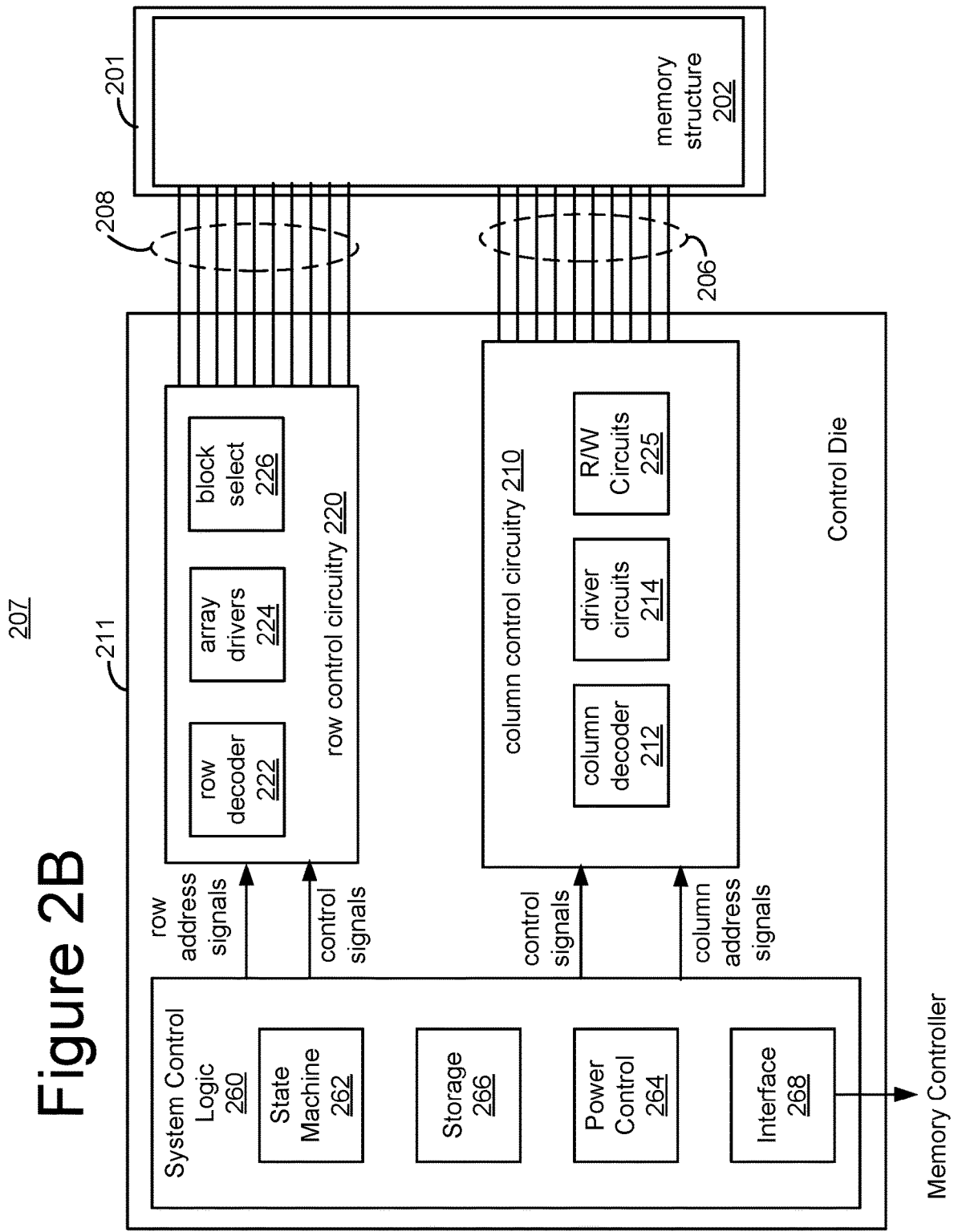
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
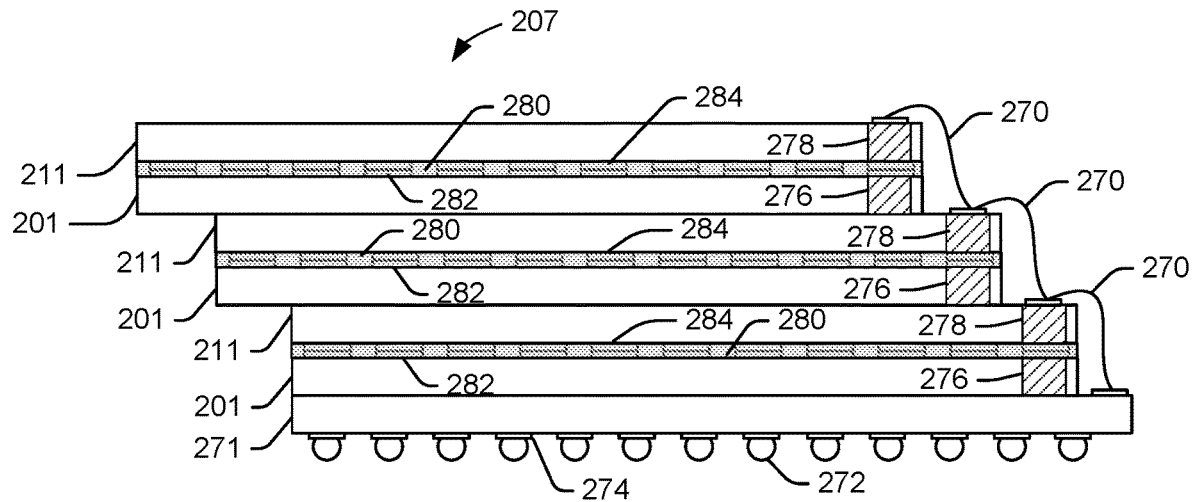
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
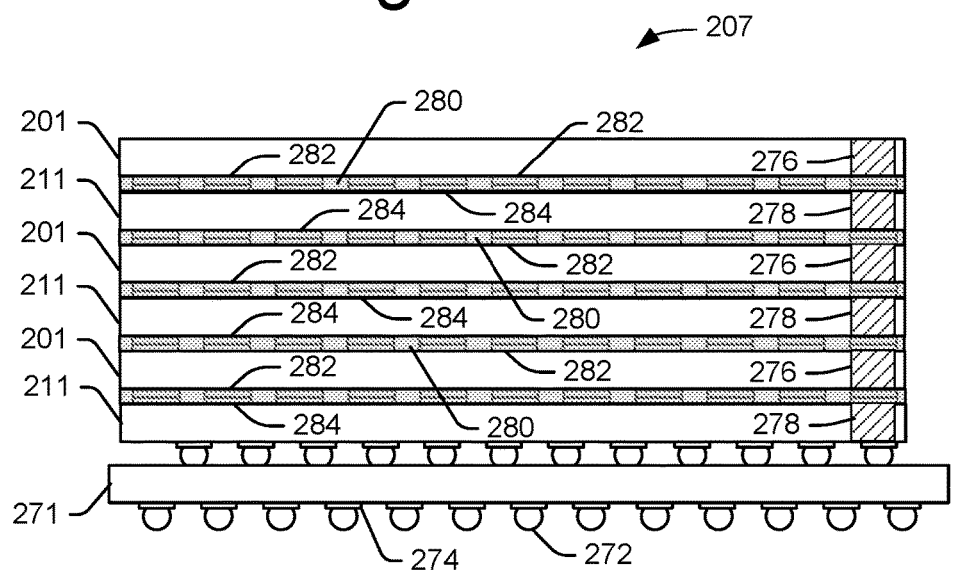

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 4:
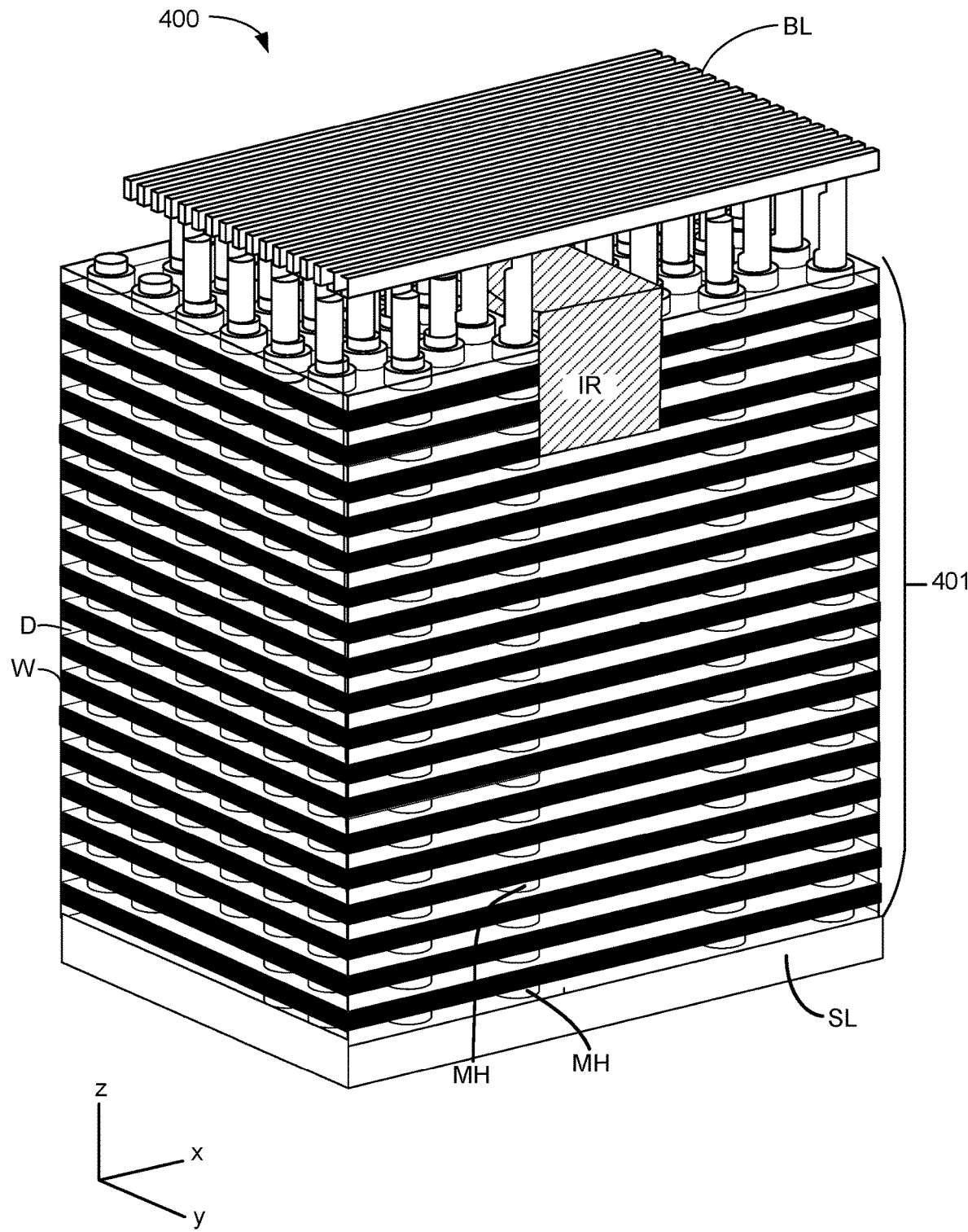
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
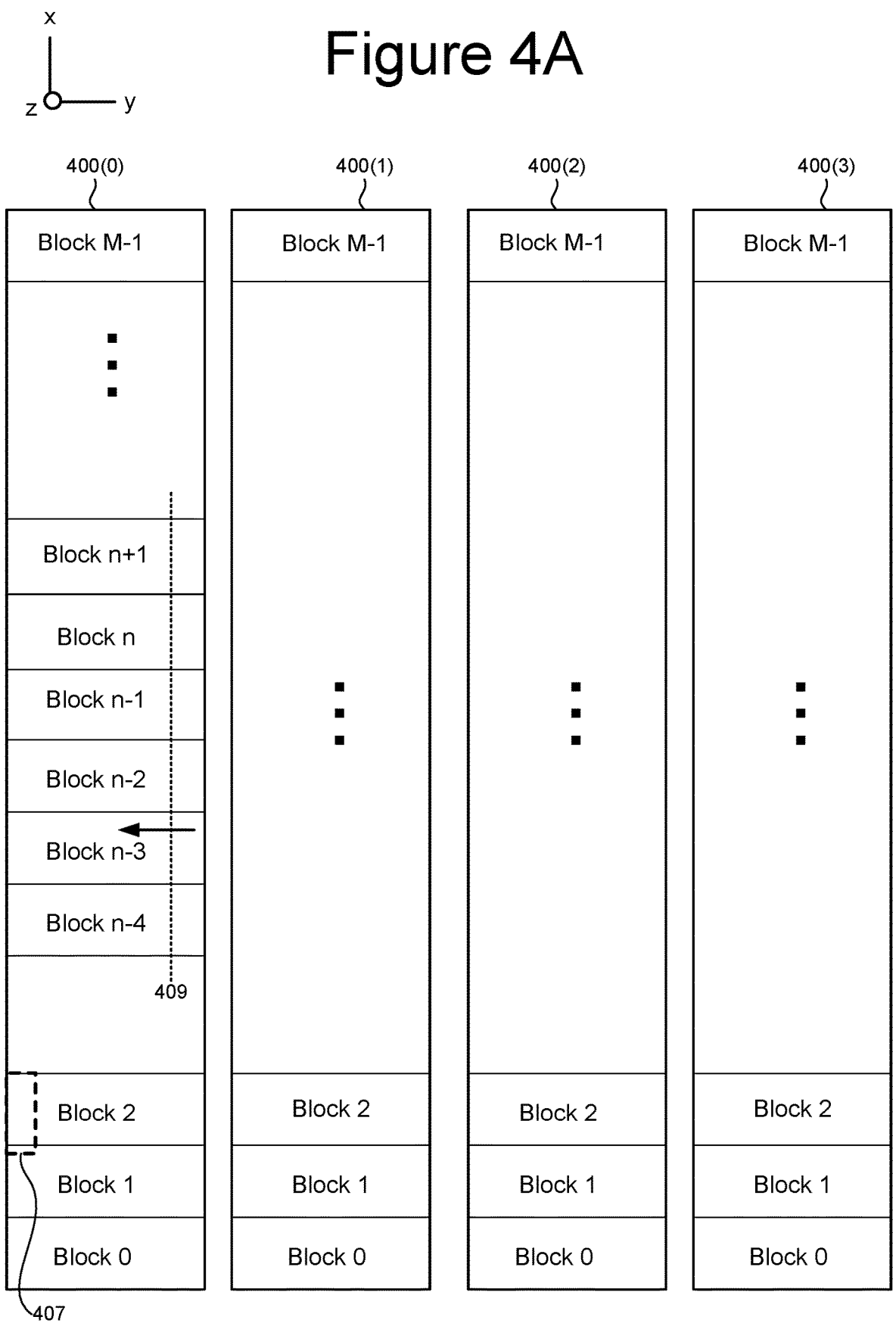
FIG. 4A is a block diagram of one embodiment of a memory structure having four planes.

FIG. 4A is a block diagram explaining one example organization of memory structure 202, which is divided into four planes 400(0), 400(1), 400(2), 400(3). Each plane is then divided into M blocks. In one example, each plane has about 2000 physical blocks. However, different numbers of physical blocks and planes can also be used. In one embodiment, a physical block of memory cells is a unit of erase. That is, all memory cells of a physical block are erased together. In other embodiments, physical blocks can be divided into sub-blocks and the sub-blocks can be the unit of erase. Memory cells can also be grouped into physical blocks for other reasons, such as to organize the memory structure to enable the signaling and selection circuits. In some embodiments, a physical block represents a groups of connected memory cells as the memory cells of a physical block share a common set of word lines. For example, the word lines for a physical block are all connected to all of the vertical NAND strings for that physical block. Although FIG. 4A shows four planes 400(0)-400(3), more or fewer than four planes can be implemented. In some embodiments, memory structure 202 includes eight planes. In some embodiments, erase disturb to a group of memory cells in one block is prevented when erasing a group of memory cells in another block. For example, a group of memory cells in Block n may be selected for erase. Those memory cells may share bit lines with memory cells in other blocks, with an erase voltage being applied to the bit lines. Moreover, in one embodiment, memory cells in Block n−1 shared word lines with memory cells in Block n. Furthermore, in one embodiment, memory cells in Block n−2 shared a source line with memory cells in Block n−1. In some embodiment, the memory system prevents erase disturb in Block n+1, Block n−1, Block n−2, Block n−3, etc. when erasing a group of cells in Block n.

Figure 4B:
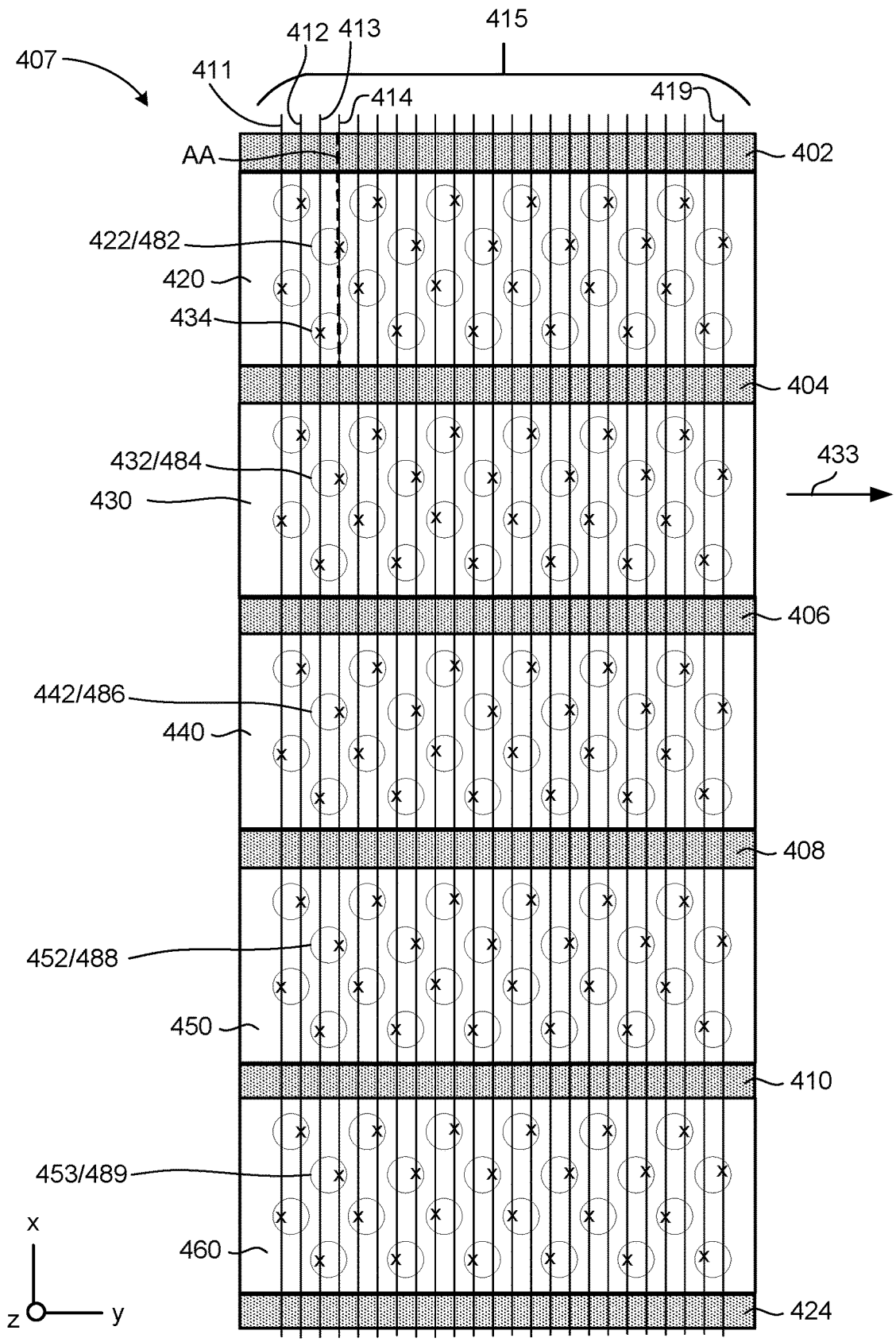
FIG. 4B is a block diagram depicting a top view of a portion of block of memory cells.

FIGS. 4B-4F depict an example three dimensional ("3D") NAND structure that corresponds to the structure of FIG. 4 and can be used to implement memory structure 202 of FIGS. 2A and 2B. FIG. 4B is a block diagram depicting a top view of a portion 407 of Block 2 in plane 400(0). As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452, and 453. Vertical column 422 implements NAND string 482. Vertical column 432 implements NAND string 484. Vertical column 442 implements NAND string 486. Vertical column 452 implements NAND string 488. Vertical column 453 implements NAND string 489. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, ... 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442, 452, and 453.

The block depicted in FIG. 4B includes a set of isolation regions 402, 404, 406, 408, 410, and 424, which are formed of $SiO_2$; however, other dielectric materials can also be used. Isolation regions 402, 404, 406, 408, 410, and 424 serve to divide the top layers of the block into five regions; for example, the top layer depicted in FIG. 4B is divided into regions 420, 430, 440, 450, and 460 of which are referred to as sub-blocks. In one embodiment, isolation regions 402 and 424 separate the block from adjacent blocks. Thus, isolation regions 402 and 424 may extend down to the substrate. In one embodiment, the isolation regions 404, 406, 408, and 410 only divide the layers used to implement select gates so that NAND strings in different sub-blocks can be independently selected. Referring back to FIG. 4, the IR region may correspond to any of isolation regions 404, 406, 408 or 410. In one example implementation, a bit line only connects to one vertical column/NAND string in each of regions (sub-blocks) 420, 430, 440, 450 and 460. In that implementation, each block has twenty rows of active columns and each bit line connects to five vertical columns/NAND strings in each block. In one embodiment, all of the five vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region having four rows of vertical columns, five regions and twenty rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
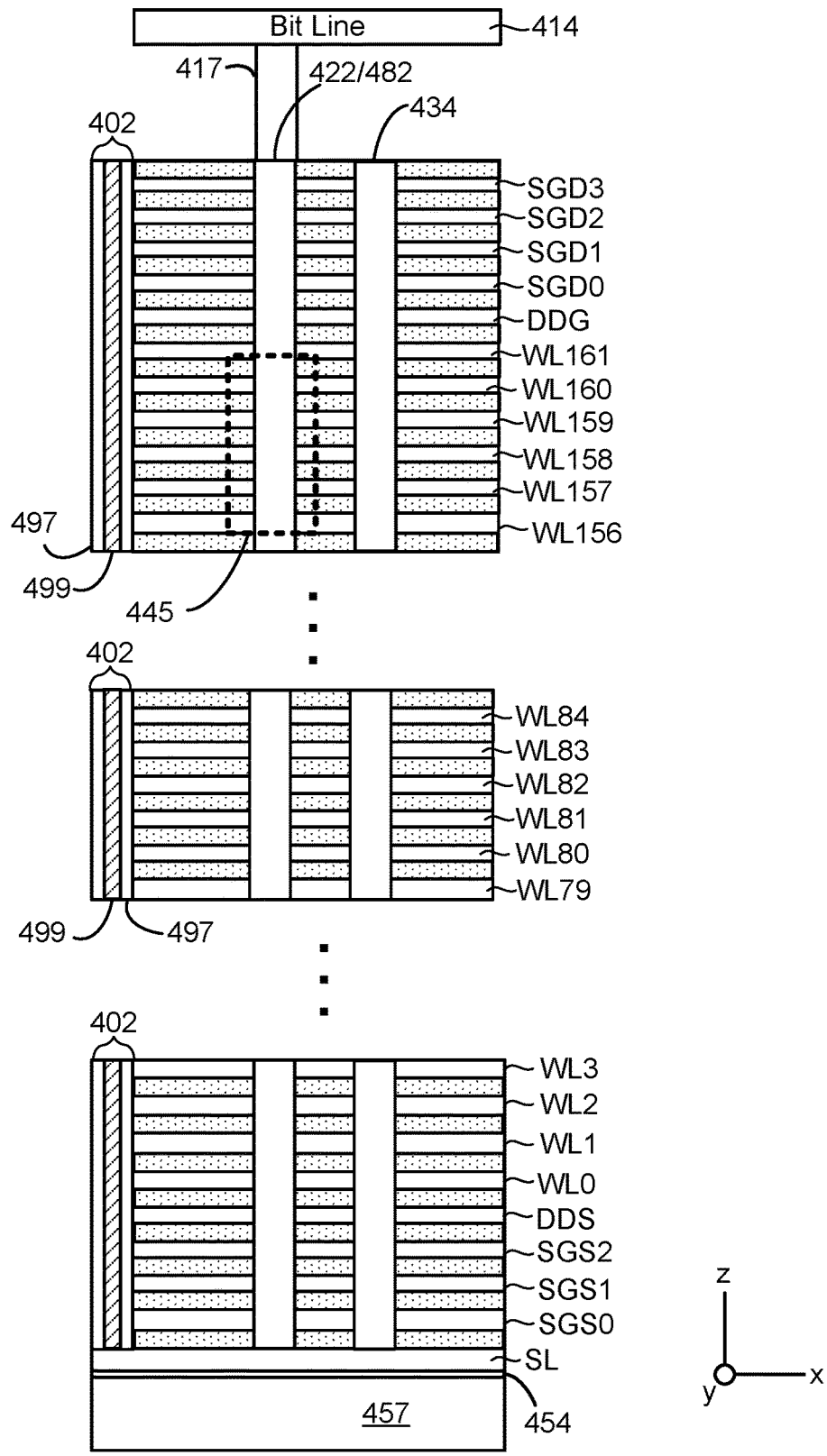
FIG. 4C depicts an embodiment of a stack showing a cross-sectional view along line AA of FIG. 4B.

FIG. 4C depicts a portion of one embodiment of a three dimensional memory structure 202 showing a cross-sectional view along line AA of FIG. 4B. This cross sectional view cuts through vertical columns (NAND strings) 422 and 434 of region 420 (see FIG. 4B). The structure of FIG. 4C includes four drain side select gate layers (SGD0, SGD1, SGD2, and SGD3). The structure of FIG. 4C also includes three source side select gate layers (SGS0, SGS1 and SGS2). The structure of FIG. 4C also includes two dummy word line layers DDS, DDG; one hundred sixty two word line layers WL0-WL161 for connecting to data memory cells. Dielectric layers are depicted between the conductive layers just described. Other embodiments can implement more or fewer than the numbers described above for FIG. 4C.

Vertical columns 432 and 434 are depicted protruding through the drain side select layers, source side select layers, dummy word line layers and word line layers. In one embodiment, each vertical column comprises a vertical NAND string. Below the vertical columns and the layers listed below is substrate 457, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to bit line 414 via connector 417.

One of the isolation regions 402 is depicted adjacent to the stack, in agreement with FIG. 4B. The isolation region 402 has a conductive region 499 surrounded by an insulating material 497. The conductive region 499 extends down to the source line (SL) and provides operating voltages to the SL. In one embodiment, an erase voltage is provided by way of conductive region 499 to the SL. The conductive region 499 may be formed from, for example, tungsten. The insulating material 497 may be formed from, for example, silicon oxide. The conductive region 499 may be referred to herein as a local interconnect (LI).

For ease of reference, drain side select layers, source side select layers, dummy word line layers, and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W161 connect to memory cells (also called data memory cells). Dummy word line layers DDS and DDG connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, SGD2, and SGD3 are used to electrically connect and disconnect (or cut off) the channels of respective NAND strings from bit lines. Source side select layers SGS0, SGS1, and SGS2 are used to electrically connect and disconnect (or cut off) the channels of respective NAND strings from the source line SL.

Figure 4D:
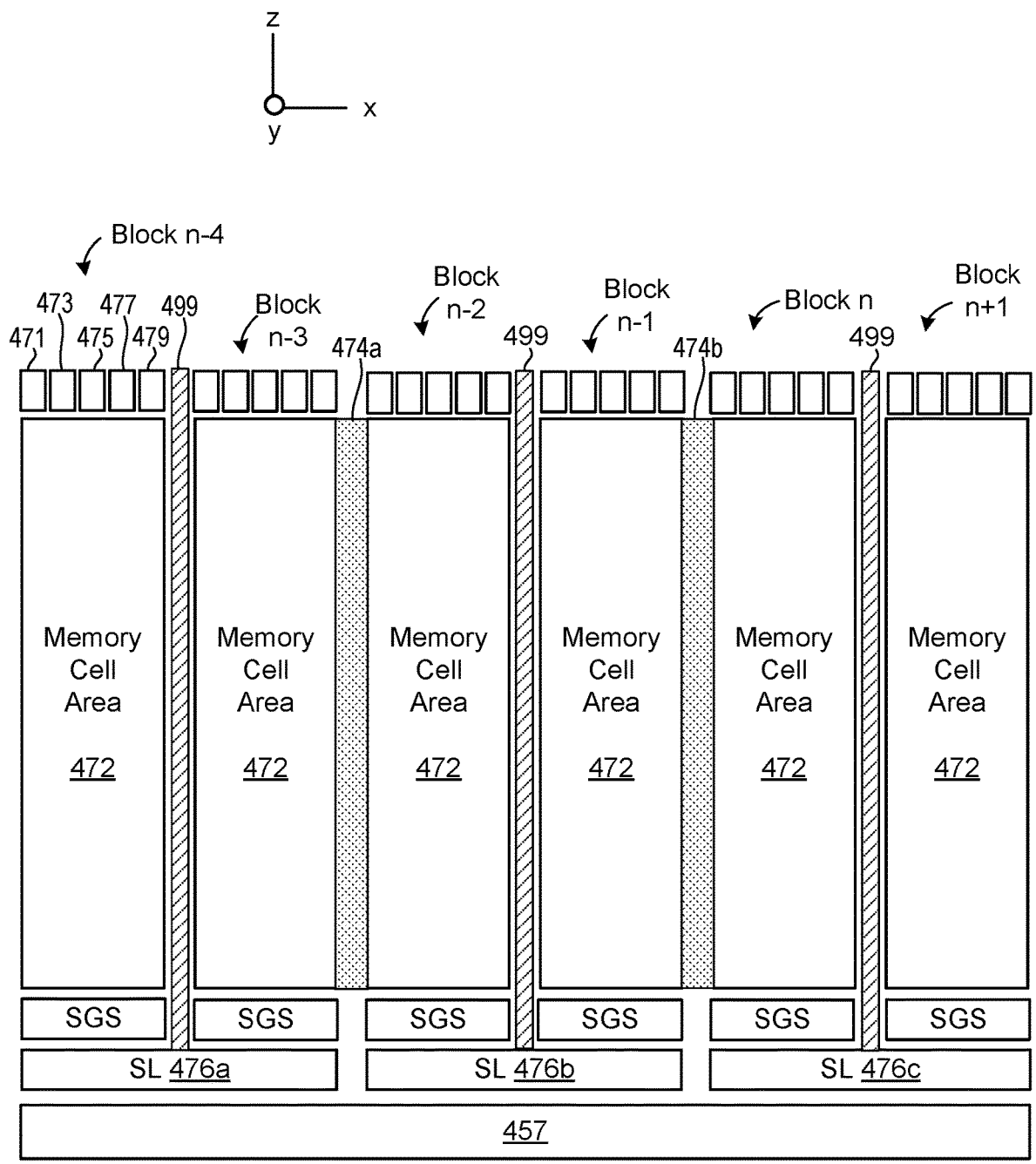
FIG. 4D depicts a section view along line 409 of FIG. 4A.

FIG. 4D depicts a section view along line 409 of FIG. 4A. A total of six blocks (Block n–4, Block n–3, Block n–2, Block n–1, Block n, and Block n+1) are depicted. These six blocks are in the same plane and share the same bit lines. The bit lines are not depicted in FIG. 4D, but may run across the top of the blocks in the x-direction. Each block has a memory cell area 472, which contains the word lines and memory cells. The memory cells reside on NAND strings. Drain side select gate regions 471, 473, 475, 477, 479 are depicted on the top of each block. Each drain side select gate region 471, 473, 475, 477, 479 may contain four select lines SGD0, SGD1, SGD2, and SGD3 (see FIG. 4C), as well as select transistors. The source side select region (SGS) is depicted on the bottom side of each block. The source side select region (SGS) contains one or more select lines (see for example, SGS0, SGS1, SGS2 in FIG. 4C), as well as select transistors.

Word line connect region 474a connects the word lines in the memory cell areas 472 of block n–2 and block n–3. Word line connect region 474b connects the word lines in the memory cell areas 472 of block n−1 and block n. Therefore, Block n shares word lines with Block n−1. Also, Block n−2 shares word lines with Block n−3. Source line SL 476a is shared between Block n−3 and n−4. In one embodiment, the shared word lines and the respective word line connect region 474 is a continuous sheet of conductive material (e.g., Tungsten). Source line SL 476b is shared between Block n−1 and n−4. Source line SL 476c is shared between Block n and n+1. The architecture depicted in FIG. 4D may be referred to herein as an interleaved shared word line/shared source line. In this architecture a block will share word lines with a neighbor block on one side and share a source line with a neighbor block on the other side. For example, Block n shares word lines with Block n−1 and shares SL 476c with Block n+1.

When memory cells in Block n are being erased preventing erase disturb to memory cells in Block n−1 presents special challenges due, in part, to the shared word lines and the shared bit lines. For example, an erase voltage (e.g., Vera) may be applied to the bit lines while applying an erase enable voltage to the word lines of Block n. Since the bit lines are shared with all of the Blocks, the erase voltage will thus be applied to the bit lines associated with the memory cells in Block n−1 (as well as the other Blocks). Moreover, the word lines in Block n−1 will have the erase enable voltage applied thereto. In one embodiment, preventing erase disturb in Block n−1 includes raising the potential of channels of memory cells in Block n−1 to a voltage applied to the SL 476b. The voltage on SL 476b has a sufficiently low magnitude to not erase the memory cells in the Block n−1 given the erase enable voltage on the word lines of Block n−1. Preventing erase disturb in the Block n−1 may also include applying a set of voltages to the select transistors of the drain side select gates in Block n−1 that prevents the erase voltage from passing from the bit lines to the channels of the memory cells in Block n−1. In an embodiment, the voltages decrease in magnitude in a direction from the bit lines to the memory cells in Block n−1. In an embodiment, the set of voltages range in magnitude between the erase voltage and the voltage on SL 476b. Therefore, gate-induced leakage current (GIDL) may be prevented at the drain side select gates. Moreover, current consumption may be kept low. Erase disturb may also be prevented in Block n+1, Block n−2, Block n−3, Block n−4, etc. by applying suitable voltages. Further details are discussed below.

Figure 4E:
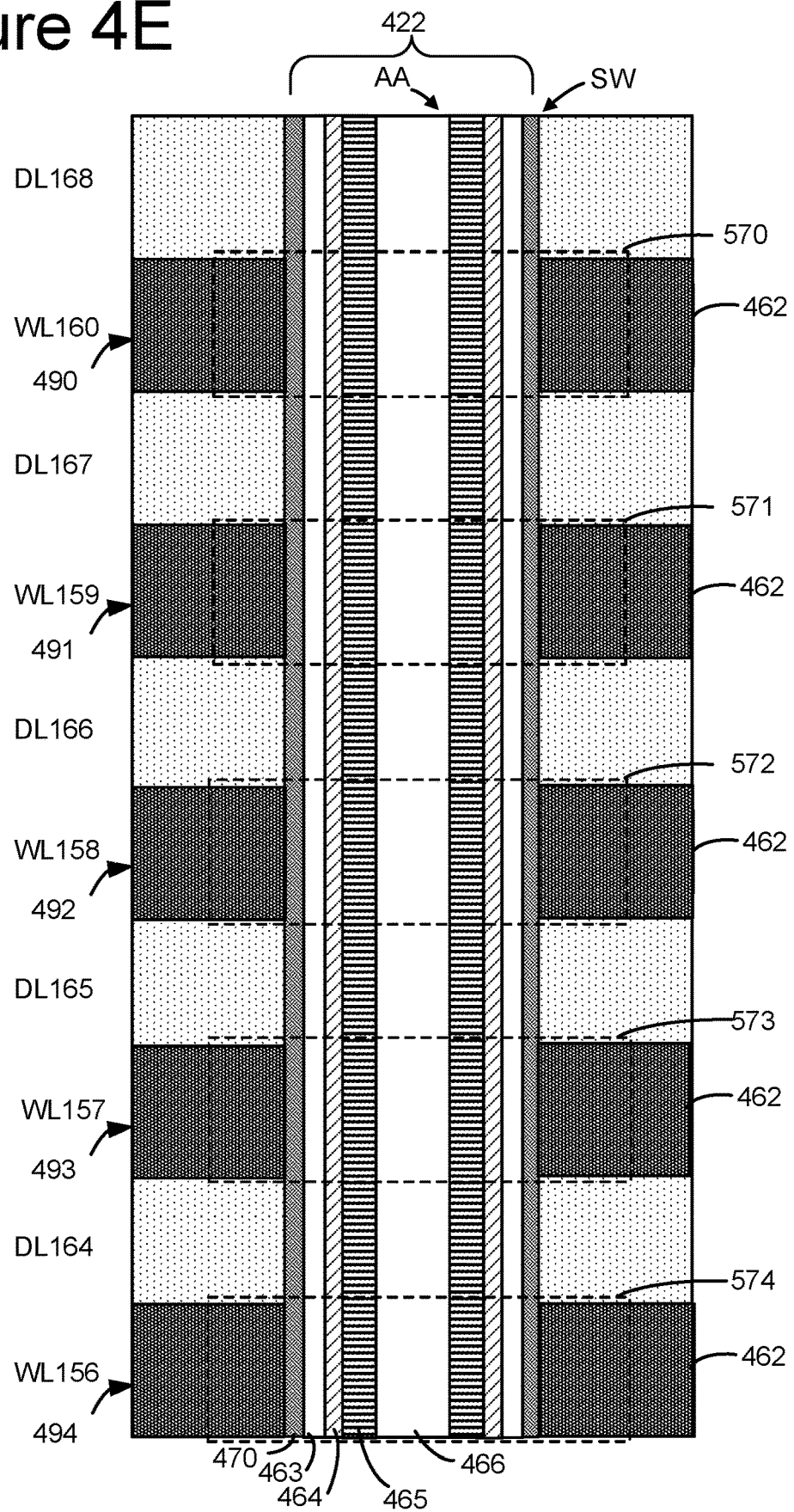
FIG. 4E depicts a view of the region 445 of FIG. 4C.

FIG. 4E depicts a view of the region 445 of FIG. 4C. Included are WL156-160 and dielectric layers DL164-DL168. Data memory cell transistors 570, 571, 572, 573, and 574 are indicated by the dashed lines. A number of layers can be deposited along the sidewall (SW) of the memory hole 422 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
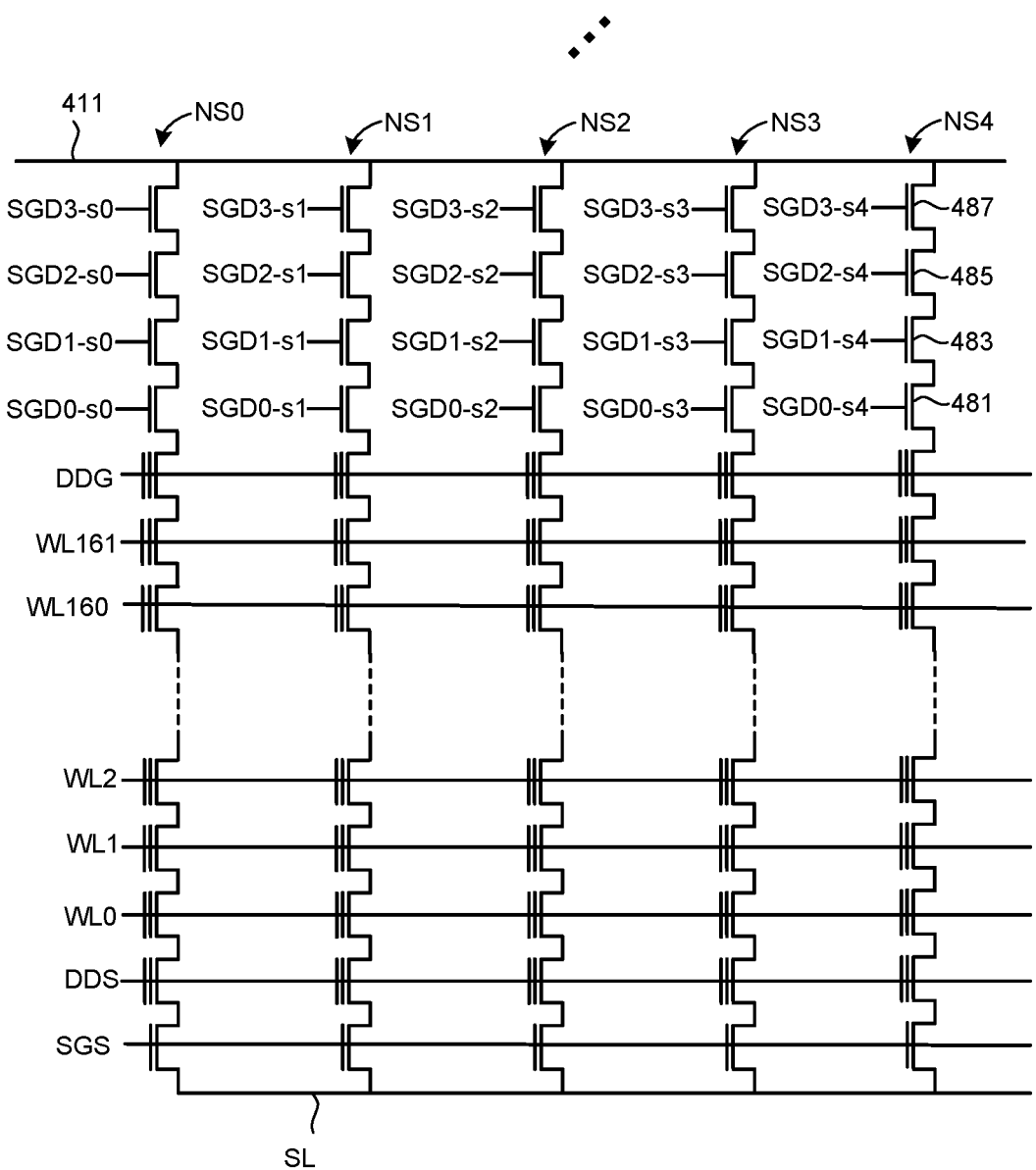
FIG. 4F is a schematic diagram of a portion of one embodiment of a block, depicting several NAND strings.

FIG. 4F is a schematic diagram of a portion of the memory depicted in in FIGS. 4-4E. FIG. 4F shows physical word lines WL0-WL161 running across the entire block. The structure of FIG. 4F corresponds to portion 407 in Block 2 of FIGS. 4A-4B, including bit lines 411, 412, 413, 414, . . . 419. Within the block, each bit line is connected to five NAND strings (e.g., NS0, NS1, NS2, NS3, NS4) in this example. The drain side select gate for each NAND string has four select transistors in this example. For example, NS4 has drain side select transistors 481, 483, 485, and 487. Each drain side select transistor on a given NAND string connects to a different drain side select line. For example, select lines SGD0-s0, SGD1-s0, SGD2-s0 c, and SGD3-s0 connect to the respective control gates of the drain side select transistors on NS0; select lines SGD0-s1, SGD1-s1, SGD2-s1, and SGD3-s1 connect to the respective gates of the drain side select transistors on NS1; select lines SGD0-s2, SGD1-s2, SGD2-s2, and SGD3-s2 connect to the respective gates of the drain side select transistors on NS2; select lines SGD0-s3, SGD1-s3, SGD2-s3 connect to the respective gates of the drain side select transistors on NS3, and SGD3-s3; and select lines SGD0-s4, SGD1-s4, SGD2-s4, and SGD3-s4 connect to the respective gates of the drain side select transistors on NS4. The aforementioned drain side select lines are used to determine which of the five NAND strings (NS0, NS1, NS2, NS3, NS4) connect to the associated bit line. Other NAND strings of the block and other bit lines are not depicted in FIG. 4F. Herein, the terms SGD0, SGD1, SGD2, and SGD3 may be used to refer to drain side select lines for the different levels without specific reference to a sub-block. Moreover, the term "SGD" may refer to any of SGD0, SGD1, SGD2, or SGD3. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. There may be more or fewer than five sub-blocks in a block.

A source side selection line SGS connects/disconnects the NAND strings to/from the common source line. In some embodiments, there is a source side select line for each sub-block (similar to the five SGD-s0, SGD-s1, SGD-s2, SGD-s3 and SGD-s4). Although a single transistor is depicted for the source side select gate of a particular NAND string, there may be more than one transistor for the source side select gate of a particular NAND string.

The block can also be thought of as divided into five sub-blocks SB0, SB1, SB2, SB3, SB4. Sub-block SB0 corresponds to those vertical NAND strings controlled by SGD-s0, Sub-block SB1 corresponds to those vertical NAND strings controlled by SGD-s1, Sub-block SB2 corresponds to those vertical NAND strings controlled by SGD-s2, Sub-block SB3 corresponds to those vertical NAND strings controlled by SGD-s3, and Sub-block SB4 corresponds to those vertical NAND strings controlled by SGD-s4.

Although the example memories of FIGS. 4-4F are three dimensional memory structure that includes vertical NAND strings with charge-trapping material, other (2D and 3D) memory structures can also be used with the technology described herein.

The memory systems discussed above can be erased, programmed and read. Each memory cell may be associated with a memory state according to write data in a program command. Based on its memory state, a memory cell will either remain in the erased state or be programmed to a memory state (a programmed memory state) different from the erased state.

For example, in a two-bit per cell memory device (sometimes referred to as a multi-level cell (MLC)), there are four memory states including the erased state and three programmed memory states referred to as the A, B and C memory states. In a three-bit per cell memory device (sometimes referred to as a tri-level cell (TLC)), there are eight memory states including the erased state and seven programmed memory states referred to as the A, B, C, D, E, F and G memory states. In a four-bit per cell memory device (sometimes referred to as a quad-level cell (QLC)), there are sixteen memory states including the erased state and fifteen programmed memory states referred to as the Er, S1, S2, S3, S4, S5, S6, S7, S8, S9, S10, S11, S12, S13, S14 and S15 memory states.

Figure 5A:
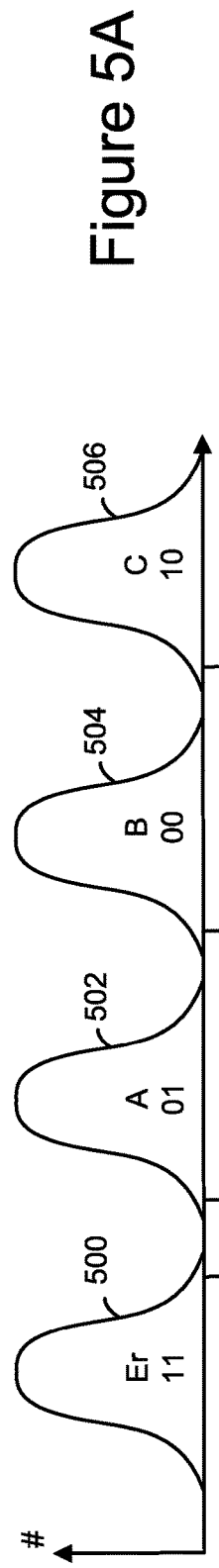
FIGS. 5A, 5B and 5C depict threshold voltage distributions.

FIG. 5A depicts an embodiment of threshold voltage Vth distributions for a four-state memory device in which each memory cell stores two bits of data. A first threshold voltage Vth distribution 500 is provided for erased (Er-state) storage elements. Three threshold voltage Vth distributions 502, 504 and 506 represent programmed memory states A, B and C, respectively. A 2-bit code having lower and upper bits can be used to represent each of the four memory states. In an embodiment, the "Er," "A," "B," and "C" memory states are respectively represented by "11," "01," "00," and "10."

Figure 5B:
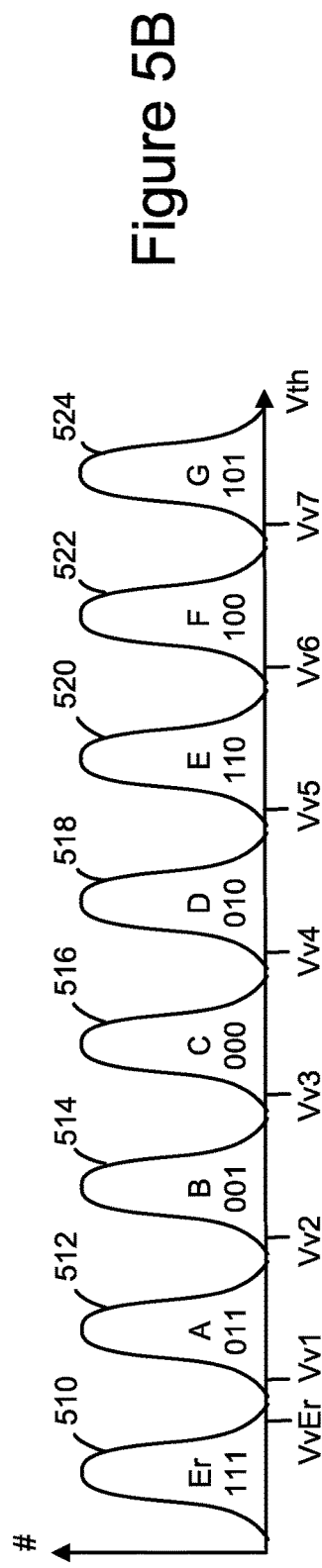

FIG. 5B depicts an embodiment of threshold voltage Vth distributions for an eight-state memory device in which each memory cell stores three bits of data. A first threshold voltage Vth distribution 510 is provided for Er-state storage elements. Seven threshold voltage Vth distributions 512, 514, 516, 518, 520, 522 and 524 represent programmed memory states A, B, C, D, E, F and G, respectively. A 3-bit code having lower page, middle page and upper page bits can be used to represent each of the eight memory states. In an embodiment, the "Er," "A," "B," "C," "D," "E," "F" and "G" memory states are respectively represented by "111,", "011," "001," "000," "010," "110," "100" and "101."

Figure 5C:
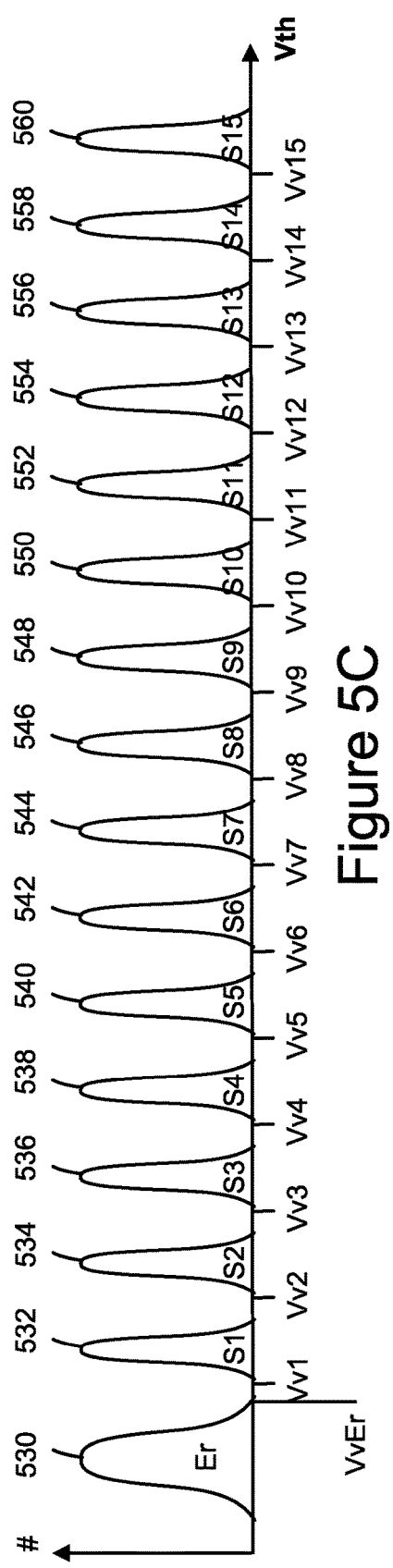

FIG. 5C depicts an embodiment of threshold voltage Vth distributions for a sixteen-state memory device in which each memory cell stores four bits of data. A first threshold voltage Vth distribution 530 is provided for erased Er-state storage elements. Fifteen threshold voltage Vth distributions 532, 534, 536, 538, 540, 542, 544, 546, 548, 550, 552, 554, 556, 558 and 560 represent programmed memory states S1, S2, S3, S4, S5, S6, S7, S8, S9, S10, S11, S12, S13, S14 and S15, respectively.

A 4-bit code having lower page, middle page, upper page and top page bits can be used to represent each of the sixteen memory states. In an embodiment, the S0, S1, S2, S3, S4, S5, S6, S7, S8, S9, S10, S11, S12, S13, S14 and S15 memory states are respectively represented by "1111," "1110," "1100," "1101," "1001," "0001," "0101," "0100," "0110," "0010," "0000," "1000," "1010," "1011," "0011," and "0111," respectively.

The technology described herein also can be used with other types of programming in addition to full sequence programming (including, but not limited to, multiple stage/phase programming). In some embodiments, programmed states (e.g., S1-S15) can overlap, with controller 120 (FIG. 1) relying on error correction to identify the correct data being stored.

In one embodiment memory cells are erased prior to programming, and erasing is the process of changing the threshold voltage of one or more memory cells from a programmed data state to an erased data state. For example, changing the threshold voltage of one or more memory cells from states A-C to state E of FIG. 5A, from states A-G to state Er of FIG. 5B, or from states S1-S15 to state Er of FIG. 5C.

FIG. 6 is a flowchart describing one embodiment of a process 600 for erasing memory cells. The process 600 may be used to erase an erase block of NAND memory cells. In one embodiment, the process 600 may be used to erase an entire physical block of NAND memory cells. In one embodiment, the process 600 may be used to erase a sub-block of the physical block of NAND memory cells. One type of sub-block are the sub-blocks selected by different select lines such as in FIG. 4F. For example, the sub-block selected by SGD-s0 may be erased independent of the other four sub-blocks. Thus, in the example in FIG. 4F, there may be five sub-blocks selected by the respective SGDs. In an embodiment, system control logic 260 performs process 600 in response to a command from the memory controller 120. Process 600 describes a double sided erase in which an erase voltage (Vera) is applied at both ends of NAND strings (e.g., bit lines and source line).

Step 602 includes setting an initial magnitude of an erase voltage (Vera). The initial Vera may have a relatively large magnitude such as, for example, 20V. Step 604 includes applying Vera to bit lines associated with the erase block. Step 606 includes applying Vera to a source line associated with the erase block. Step 608 includes applying an erase enable to the word lines in the erase block (e.g., the selected word lines connected to the selected memory cells). In one embodiment, the erase enable voltage is 0V. Step 610 includes applying a select voltage to select lines (e.g., SGD, SGS). The select voltage allows Vera to pass to the NAND channels. In an embodiment, GIDL is generated at both the source end and the drain end of the NAND strings to pass the erase voltage to the channels of the memory cells.

Thus, the erase of a memory cell includes applying an erase enable voltage (e.g., 0V) to the control gate of the memory cell while applying an erase voltage (e.g., about 20V) to a channel or body of the memory cell. An erase voltage is defined herein as a voltage applied to a channel or body of a memory cell that will erase the memory cell providing that the erase enable voltage is also applied to a control gate of that memory cell. A memory cell that has the erase voltage applied to its channel (body) may be inhibited from erase by applying an erase inhibit voltage (e.g., the erase voltage or about 20V) to its control gate. An erase inhibit voltage is defined herein as a voltage that will inhibit erase of a memory cell despite the erase voltage being applied to a channel of that memory cell.

One approach to erasing memory cells is to generate gate induced drain leakage (GIDL) current to charge up the NAND string channel. An erase enable voltage is applied to control gates of the memory cells, while maintaining the string channel potential to erase the memory cells. The GIDL current is generated by causing a drain-to-gate voltage at a select transistor (drain side and/or source side), in one embodiment. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel 465, thereby raising the potential of the channel 465. The other type of carriers, e.g., electrons, are extracted from the channel 465, in the direction of a bit line or in the direction of a source line, by an electric field. During erase, the holes may tunnel from the channel to a charge storage region 463 of memory cells and recombine with electrons there, to lower the threshold voltage of the memory cells.

After steps 604-610 are performed, an erase verify may be performed in step 612. The erase verify may apply for example VvEr (See FIGS. 5A-5C) to each data WLs in the erase block. If all memory cells in the erase block on a given NAND string have a Vt below VvEr then the NAND string will conduct a significant current. In some embodiments, if a NAND string passes erase of the NAND string may end at this point. Step 614 is a determination of whether erase is complete. If not the magnitude of the erase voltage may optionally be increased in step 616. Thus, steps 604-614 are repeated. When all NAND strings have passed erase the process ends. In some embodiments, erase may end with a few NAND strings having yet to pass erase.

Figure 7:
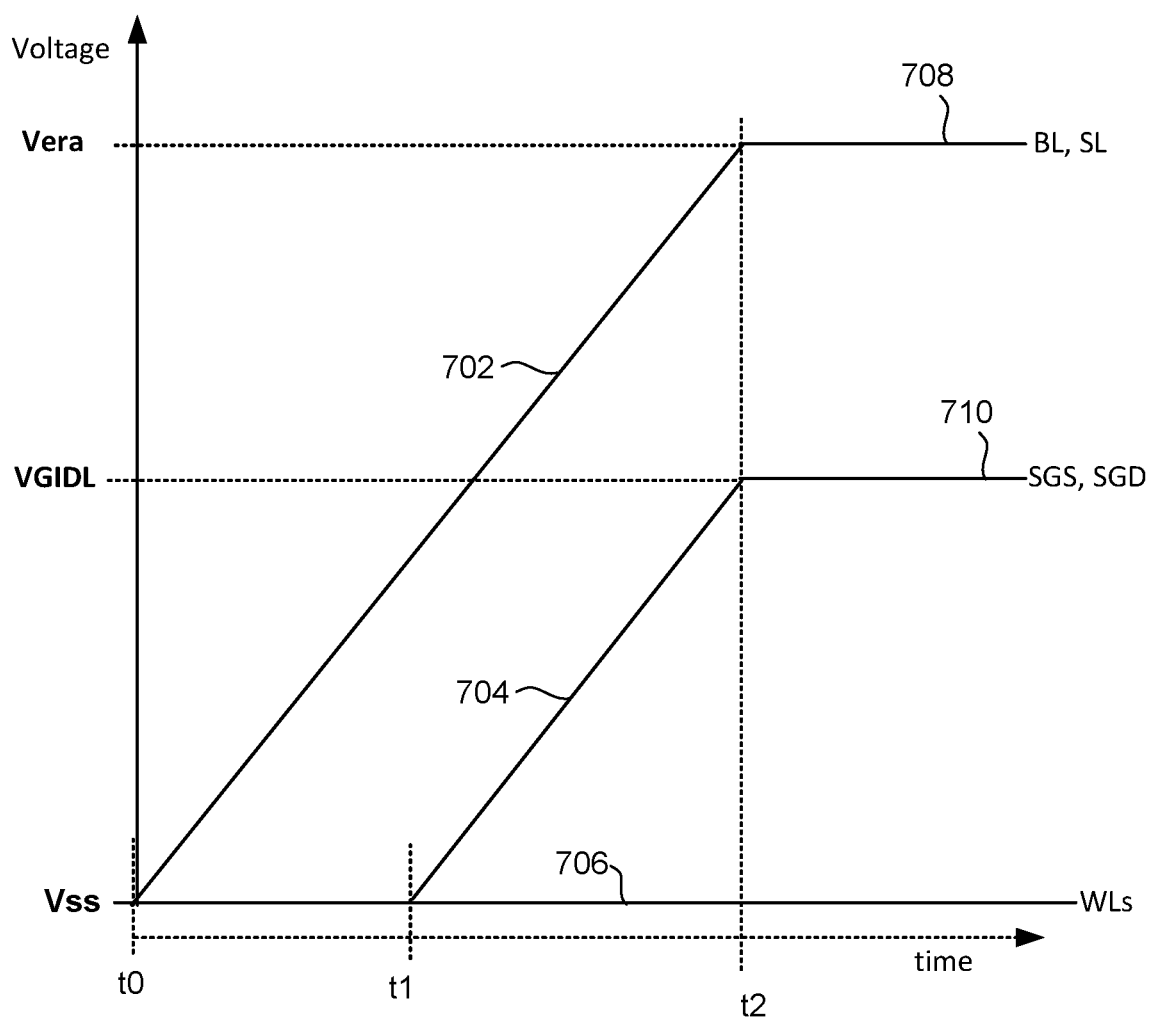
FIG. 7 shows timing of voltages applied when performing an embodiment of erase.

FIG. 7 shows timing of voltages applied when performing an embodiment of erase. The voltages may be applied during steps 604-610 of an embodiment of process 600. At time t0, the voltage to the source line (SL) and the bit lines (BL) begins to ramp up from Vss (0V) to the target voltage of Vera (plot 702). At time t1 the voltage to the control gates of the source side select transistors and the voltage to the control gates of the drain side select transistors begins to ramp up from Vss to the target voltage of VGIDL (plot 704). Stated another way, the voltage on the source side select line SGS and the voltage on the drain side select lines (e.g., SDG0, SGD1, SGD2, SGD3) begins to ramp up (plot 704). The word line (WL) voltage is kept at Vss (e.g., 0V) during the erase (plot 706). By time t2, the voltages on the source line (SL) and the bit lines (BL) reach the erase voltage (Vera) (see plot 708). An example voltage for Vera is 23V. By time t2, the voltage on the SGS and the voltage on the SDG0, SGD1, SGD2, SGD3 reach their respective target voltage (plot 710). An example target voltage for SGS and SGD is 13V. In the foregoing example the difference between Vera and SGS is 10V which is a sufficient gate-drain difference for GIDL generation. Likewise, the difference between Vera and SGD is 10V which is a sufficient gate-drain difference for GIDL generation. As a result, the source line and the bit line voltage (Vera) is passed to the channels of the memory cells. The difference between the channel voltage (Vera) and the word line voltage will erase the memory cells. The word line voltage may be referred to herein as an erase enable voltage.

Figure 8:
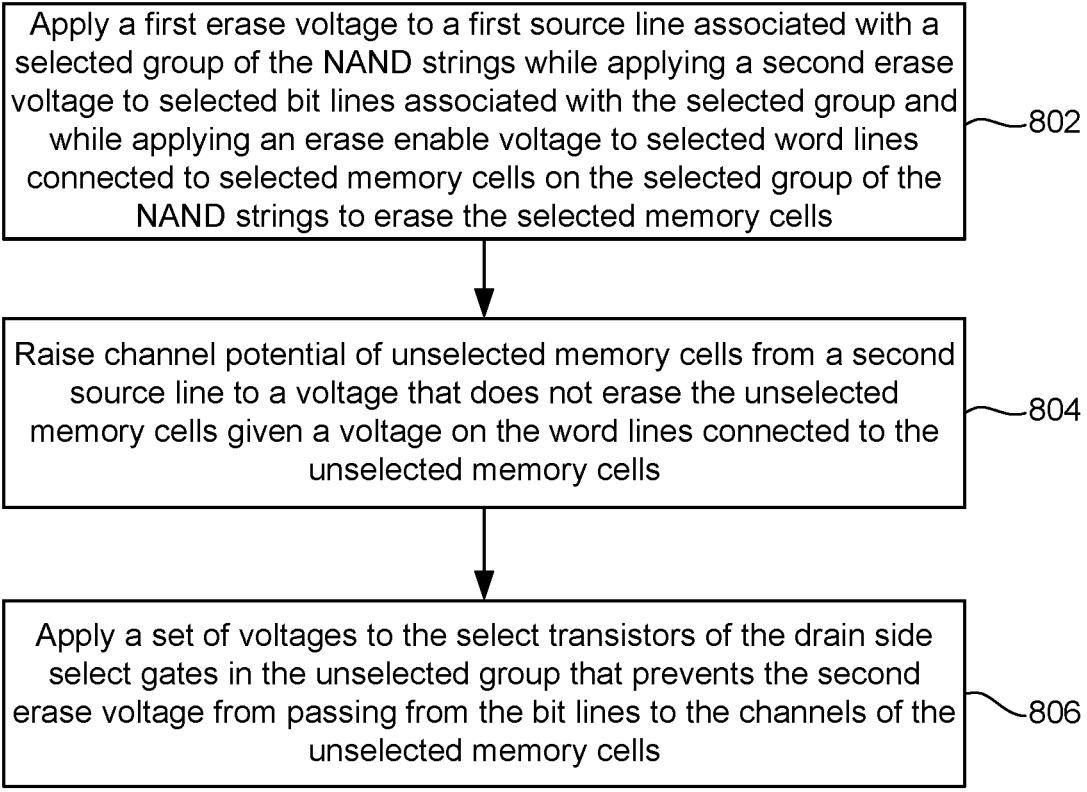
FIG. 8 is a flowchart of one embodiment of a process of preventing erase disturb.

Technology is disclosed herein for preventing erase disturb in unselected groups of memory cells when erasing a selected erase group of memory cells. FIG. 8 is a flowchart of one embodiment of a process 800 of preventing erase disturb. The process 800 may be performed by one or more control circuits, which may include, but is not limited to, any one of or any combination of memory controller 120, state machine 262, power control 264, all or a portion of system control logic 260, all or a portion of row control circuitry 220, all or a portion of column control circuitry 210, and/or read/write circuits 225.

Step 802 includes applying a first erase voltage to a first source line associated with a selected group of NAND strings while applying a second erase voltage to selected bit lines associated with the selected group and while applying an erase enable voltage to selected word lines connected to selected memory cells on the selected group of the NAND strings to erase the selected memory cells. As one example, the selected memory cells are in Block n. In one embodiment, the first erase voltage and the second erase voltage have the same magnitude. Steps 604-610 of process 600 provides further details for one embodiment of step 802.

Step 804 includes raising a channel potential of unselected memory cells from a second source line to a voltage that does not erase the unselected memory cells given a voltage on the word lines connected to the unselected memory cells. The unselected memory cells reside on an unselected group of NAND strings that shares the selected bit lines. In an example in which the cells being erased are in Block n, the unselected group may be in Block n–1, Block n–2, Block n–3, Block n–4, or some other group of cells that shares bit lines with the cells being erased. Further details of step 804 are described below in connection with FIGS. 9, 11, 12 and 15.

Step 806 includes applying a set of voltages to the select transistors of the drain side select gates in the unselected group of NAND strings that prevents the second erase voltage from passing from the bit lines to the channels of the unselected memory cells. The voltages in the set decrease in a direction away from the bit lines. In an embodiment, the set of voltages range in magnitude between the second erase voltage and the voltage that was passed to the channels of the unselected memory cells. The voltages prevent the second erase voltage from passing from the bit lines to the channels of the unselected memory cells. The set of voltages prevent may prevent GIDL generation in the select transistors of the drain side select gates. Moreover, current consumption is kept very low.

Figure 9:
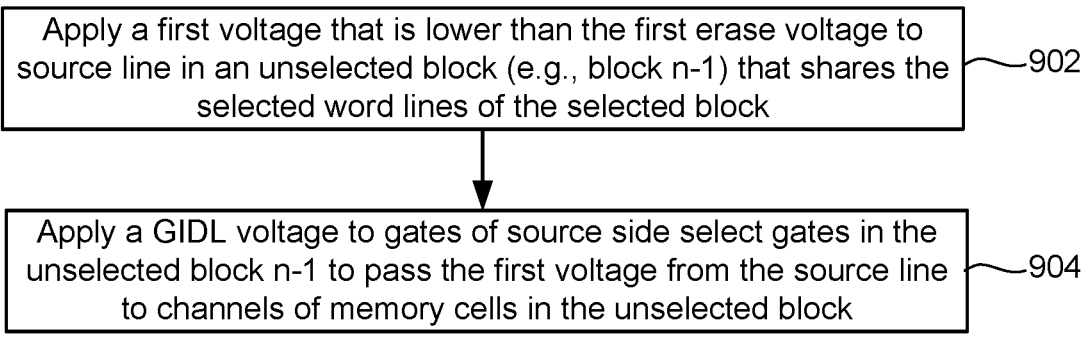
FIG. 9 is a flowchart of one embodiment of a process of raising the channel potential of memory cells in an unselected group that shares word lines with the memory cells being erased.

FIG. 9 is a flowchart of one embodiment of a process 900 of raising the channel potential of unselected memory cells while erasing the selected memory cells. The process 900 provides further details of one embodiment of step 804 in FIG. 8. In process 900 the unselected memory cells share word lines with the selected memory cells. An example will be discussed in which the selected memory cells are in Block n and the unselected memory cells are in Block n–1 (see FIG. 4D); however, process 900 is not limited to this example. Process 900 may be performed in combination with process 600.

Step 902 includes applying a first voltage that is lower than the first erase voltage to source line in an unselected block shares the selected word lines of the selected block. For example, the first voltage is applied to SL 467b. Note that SL 467b is associated with Block n–1, which shares word lines with Block n. In an embodiment, the first voltage is about 11V.

Step 904 includes applying a GIDL voltage to control gates of source side select gates in the unselected block to pass the first voltage from the source line to channels of unselected memory cells in the unselected block. The GIDL voltage has a magnitude that in combination with the first voltage applied to the source line will result in GIDL generation in the source side select gates. In an embodiment, the GIDL voltage is about 1V, given that the first voltage is about 11V. For example, the GIDL voltage is applied to SGS that is connected to gates of source side select transistors in block n−1. Process 900 thereby results in the first voltage passing to the channels of unselected memory cells in the unselected block n−1. Since the word lines in unselected block n−1 are shared with the selected block n this means that the word lines in unselected block n−1 will have the erase enable voltage (e.g., 0V) applied thereto. However, the voltage difference between the channels and control gates of the unselected memory cells (11V-0V) is not sufficient to erase the unselected memory cells. Therefore, erase disturb is prevented.

FIG. 10 shows timing of voltages applied when performing an embodiment of preventing erase disturb in unselected memory cells that share word lines with the selected memory cells being erased. In one embodiment, the voltages are applied when preventing erase disturb in unselected block n−1 (when block n is selected for erase). The voltages may be applied during steps 902-904 of an embodiment of process 900, as well as in an embodiment of step 806. These voltages may be applied in combination with the voltages depicted in FIG. 7 being applied to the selected block n.

At time t0, the voltage to the source line (SL) and the bit lines (BL) begins to ramp up from Vss to their respective target voltages (plot 1002a). Note that block n−1 shares bit lines with block n. However, block n−1 does not share a source line with block n. Also, note that whereas the source line voltage ramps up to Vera for the selected block n, the source line voltage only ramps up to about 11V for the unselected block n−1. Here, 11V is an example, a higher or lower voltage could be used. The source line voltage reaches its target voltage (e.g., 11V) at t5. The bit line voltage continues to ramp (plot 1002b) and reaches Vera at t7. The voltage on SGS begins to ramp up at t4 (see plot 1012) and reaches its target (e.g., 1V) at t5. In the foregoing example the difference between the SL voltage and SGS voltage is 10V, which is a sufficient gate-drain difference to generate a GIDL current. As a result, the source line voltage (e.g., 11V) may be passed to the channels of the memory cells. However, The difference between the memory cell channel voltage (e.g., 11V) and the word line voltage (0V) will not erase the unselected memory cells in the unselected block n−1. Note that times t1 and t2 in FIG. 10 do not correspond to times t1 and t2 in FIG. 7. However, in one embodiment, t2 in FIG. 7 corresponds to t7 in FIG. 10.

FIG. 10 also depicts the voltages applied to the drain side select lines (SGD0, SGD1, SGD2, SGD3). As noted in step 806 of FIG. 8, a set of voltages are applied to the drain side select gates in the unselected block. FIG. 10 shows that the times for starting to ramp-up these voltages are staggered (see plots 1004, 1006, 1008, 1010). In an embodiment, the start times are staggered such that each voltage in the set reaches its target voltage at about the same time (e.g., t7). Moreover, the start times are staggered such that the difference in voltage between one SGD and its neighbors remains relatively constant during ramp-up, which may prevent GIDL generation. The highest voltage is applied to SGD3 with progressively lower voltages being applied to SGD2, SGD1, and SGD0. Thus, the highest voltage is applied to the drain select transistor that is nearest the bit line and the lowest voltage is applied to the drain select transistor that is nearest the memory cells. These voltages may range between the erase voltage (Vera) and the SL voltage. As one example, the voltages are about 22V, 19V, 15V, and 11V corresponding to SGD3, SGD2, SGD1, and SGD0 respectively. This set of voltages will not result in GIDL generation in the drain side select transistors (this statement applies both to ramp-up and steady state at the target levels). Therefore, current consumption is very low. Moreover, the erase voltage (Vera) that is on the bit lines will not be passed to the channels of the memory cells in the unselected block n−1.

FIG. 11 is a flowchart of one embodiment of a process 1100 of raising the channel potential of memory cells in an unselected group. The process 1100 provides further details of one embodiment of step 804 in FIG. 8. In process 1100 the unselected memory cells do not share word lines with the memory cells that were selected for erase. However, the unselected memory cells share a source line with the unselected memory cells that share word lines with the selected memory cells. An example will be discussed in which the selected memory cells are in Block n and the unselected memory cells of process 1100 are in Block n−2 (see FIG. 4D); however, process 1100 is not limited to this example. Process 1100 may be performed in combination with process 600 and process 900. However, process 1100 is not required to be performed in combination with process 600 and/or process 900.

Step 1102 includes applying the first voltage that is lower than the erase voltage to the source line in the unselected block n−2. For example, the first voltage is applied to SL 467b. Note that SL 467b is shared between Block n−1 and Block n−2. As has been described with respect to process 900, the first voltage may be applied to SL 476b when prevented erase disturb in Block n−1. In an embodiment, the first voltage is about 11V.

Step 1104 includes applying a GIDL voltage to gates of source side select gates in the unselected block n−2 to pass the first voltage from the source line to channels of memory cells in the unselected block n−2. In an embodiment, the GIDL voltage is about 1V, given that the first voltage is about 11V. For example, the GIDL voltage is applied to SGS that is connected to control gates of source side select transistors in block n−2. Process 1100 thereby results in the first voltage passing to the channels of memory cells in the unselected block n−2.

Step 1106 includes applying a voltage to the word lines in the unselected block n−2 that prevents erase of memory cells in block n−2 given the channel potential. With reference to FIG. 4D note that the word lines of Block n−2 are not shared with the word lines of Block n−1 (nor with Block n). Therefore, the memory system is free to apply a voltage other than the erase enable voltage to the word lines. In one embodiment, the voltage applied to the word lines is about 8V. Therefore, the voltage difference between the channels and control gates of the unselected memory cells (11V−8V=3V) is not sufficient to erase the unselected memory cells. Therefore, erase disturb is prevented to the unselected memory cells in block n−2.

Figure 13:
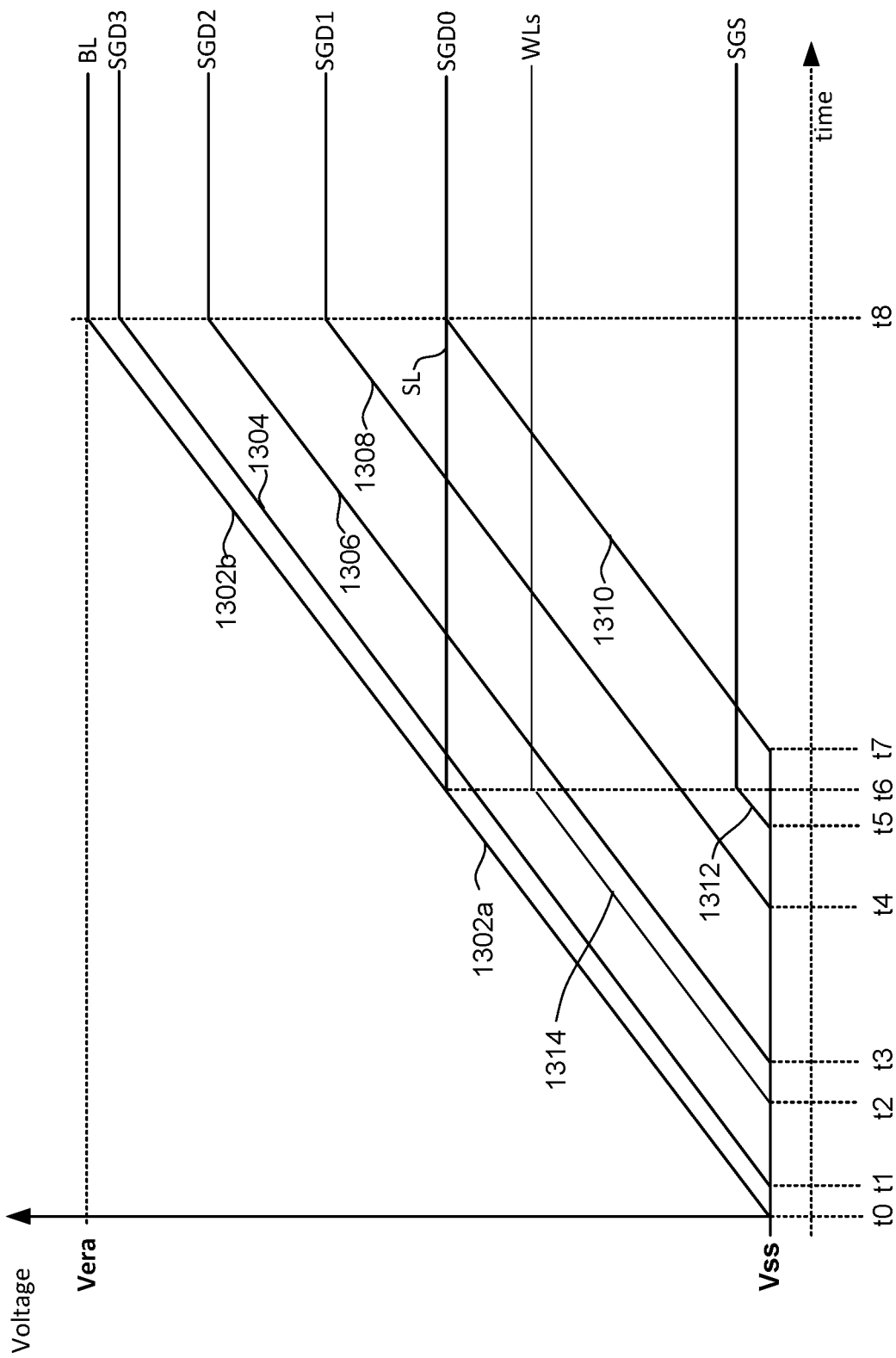
FIG. 13 shows timing of voltages applied when performing an embodiment of preventing erase disturb in an unselected group that shares a source line with an unselected group that shares word lines with the selected group.

FIG. 13 shows timing of voltages applied when performing an embodiment of preventing erase disturb. In one embodiment, the voltages are applied when preventing erase disturb in unselected block n−2 (when block n is selected for erase). The voltages may be applied during process 1100, in combination with an embodiment of step 806. These voltages in FIG. 13 may be applied in combination with the voltages depicted in FIG. 7 being applied to the selected block n. These voltages in FIG. 13 may be applied in combination with the voltages depicted in FIG. 10 being applied to the selected block n−1.

At time t0, the voltage to the source line (SL) and the bit lines (BL) begins to ramp up from Vss (plot 1302a). Note that block n–2 shares bit lines with block n. Therefore, the bit lines ramp up to Vera (plot 1302b). However, block n–2 does not share a source line with block n. Moreover, block n–2 does not share word lines with block n. However, block n–2 shares a source line with block n–1. Therefore, the source line voltage ramps up to the source line voltage of Block n–1 (e.g., 11V). The bit line voltage reaches Vera at t8 (which corresponds to t2 in FIG. 7). The source line voltage reaches its target voltage (e.g., 11V) at t6 (which corresponds to t5 in FIG. 10). The voltage on SGS begins to ramp up at t4 (see plot 1312) and reaches its target (e.g., 1V) at t6 (which corresponds to t5 in FIG. 10). In the foregoing example the difference between the SL voltage and SGS voltage is 10V which is a sufficient gate-drain difference to generate a GIDL current. As a result, the source line voltage (e.g., 11V) may be passed to the channels of the memory cells. The word line voltages begin to ramp up at t2 (see plot 1314) and reach their target at t6. In an embodiment, the word line voltages are about 8V. Thus, the difference between the memory cell channel voltage (e.g., 11V) and the word line voltage (8V) will not erase the unselected memory cells in the unselected block n–2.

FIG. 13 also depicts the voltages applied to the drain side select lines (SGD0, SGD1, SGD2, SGD3). As noted in step 806 of FIG. 8, a set of voltages are applied to the drain side select gates in the unselected block. FIG. 13 shows that the times for ramping up these voltages are staggered (see plots 1304, 1306, 1308, 1310). In an embodiment, the start times are staggered such that each voltage in the set reaches its target voltage at about the same time (e.g., t8). Moreover, staggering the start times may prevent GIDL generation during voltage ramp-up. Therefore, current consumption is reduced. The highest voltage is applied to SGD3 with progressively lower voltages being applied to SGD2, SGD1, and SGD0. Thus, the highest voltage is applied to the drain select transistor that is nearest the bit line and the lowest voltage is applied to the drain select transistor that is nearest the memory cells. These voltages may range between the erase voltage (Vera) and the SL voltage. As one example, the voltages are about 22V, 19V, 15V, and 11V corresponding to SGD3, SGD2, SGD1, and SGD0 respectively. In this example, the voltage on SGD0 is about the same as the voltage on the SL. This set of voltages will not result in GIDL generation in the drain side select transistors. Therefore, current consumption is very low. Moreover, the erase voltage (Vera) that is on the bit lines will not be passed to the channels of the memory cells in the unselected block n–2.

FIG. 12 is a flowchart of one embodiment of a process 1200 of raising the channel potential of memory cells in an unselected group. The process 1200 provides further details of one embodiment of step 804 in FIG. 8. In process 1200 the unselected memory cells do not share word lines with the memory cells that were selected for erase. However, the unselected memory cells share word lines line with the unselected memory cells in block n–2. An example will be discussed in which the selected group is in Block n and the unselected memory cells of process 1200 are in Block n–3 (see FIG. 4D); however, process 1200 is not limited to this example. Process 1200 may be performed in combination with process 600, process 900, and/or process 1100. However, process 1100 is not required to be performed in combination with process 600, process 900, and/or process 1100.

Step 1202 includes applying a second voltage that is lower than the erase voltage to the source line in the unselected block n–3. For example, the second voltage is applied to SL 467a. Note that SL 467a is shared between Block n–3 and Block n–4. In an embodiment, the second voltage is about 18V. Thus, in an embodiment, the second voltage applied to SL 476a is greater than the first voltage applied to SL 476b, but less than the erase voltage (Vera) applied to SL 476c.

Step 1204 includes applying a GIDL voltage to gates of source side select gates in the unselected block n–3 to pass the second voltage from the source line to channels of memory cells in the unselected block n–3. In an embodiment, the GIDL voltage is about 8V, given that the second voltage is about 18V. Therefore, the drain to gate voltage is about 10V, which is sufficient for GIDL current generation.

Step 1206 includes applying a voltage to the word lines in the unselected block n–3 that prevents erase of memory cells in block n–3 given the channel potential. With reference to FIG. 4D note that the word lines of Block n–3 are shared with the word lines of Block n–2. Therefore, assuming that the memory system applied about 8V to the word lines in Block n–2, this 8V will also be applied to the word lines in Block n–3. Therefore, the voltage difference between the channels and control gates of the unselected memory cells (18V–8V=10V) is not sufficient to erase the unselected memory cells. Therefore, erase disturb is prevented to the unselected memory cells in block n–3. Process 1200 thereby results in the second voltage passing to the channels of unselected memory cells in the unselected block n–3.

Figure 14:
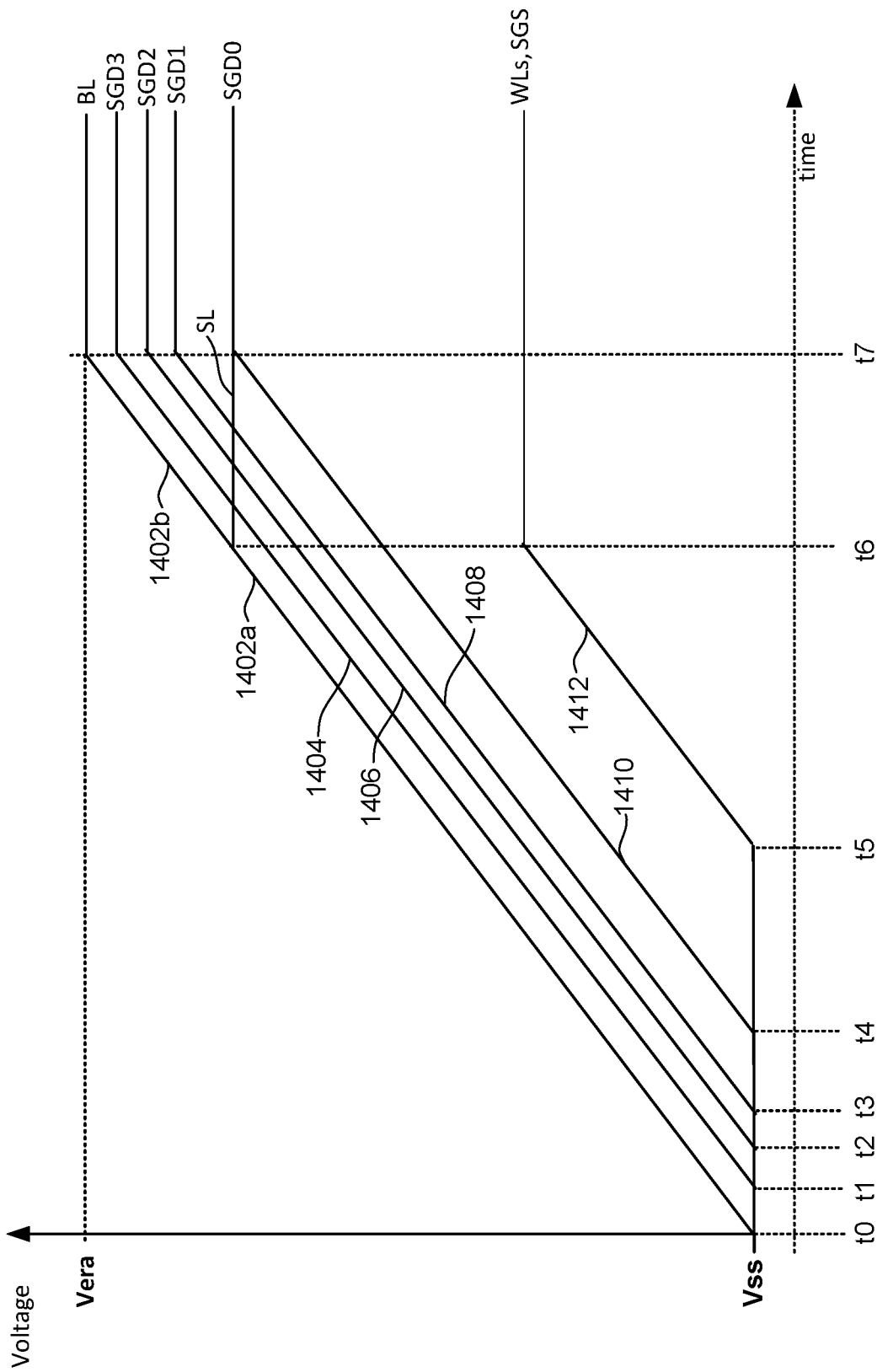
FIG. 14 shows timing of voltages applied when performing an embodiment of preventing erase disturb in an unselected group that shares word lines with an unselected group that does not share word lines with the selected group.

FIG. 14 shows timing of voltages applied when performing an embodiment of preventing erase disturb. In one embodiment, the voltages are applied when preventing erase disturb to unselected memory cells in unselected block n–3 (when memory cells in block n are selected for erase). The voltages may be applied during process 1200, in combination with an embodiment of step 806. These voltages in FIG. 14 may be applied in combination with the voltages depicted in FIG. 7 being applied to the selected block n. These voltages in FIG. 14 may be applied in combination with the voltages depicted in FIG. 10 being applied to the block n–1. These voltages in FIG. 14 may be applied in combination with the voltages depicted in FIG. 13 being applied to the block n–2.

At time t0, the voltage to the source line (SL) and the bit lines (BL) begins to ramp up from vss towards their respective target voltage (plot 1402a). Note that block n–3 shares bit lines with block n. Therefore, the bit lines ramp up to Vera (plot 1402b). However, block n–3 does not share a source line or word lines with block n. Moreover, block n–3 does not share a source line with block n–1 or block n–2. The source line voltage ramps up to the target source line voltage of Block n–3 (e.g., 18V). The bit line voltage reaches Vera at t7 (which corresponds to t2 in FIG. 7). The source line voltage reaches its target voltage (e.g., 18V) at t6. The voltage on SGS begins to ramp up at t5 (see plot 1412) and reaches its target (e.g., 8V) at t6. In the foregoing example the difference between the SL and SGS is 10V which is a sufficient gate-drain difference to generate a GIDL current. Moreover, this difference may be maintained during ramp-up to create GIDL current when ramping SGS. As a result, the source line voltage (e.g., 18V) may be passed to the channels of the memory cells. Block n–3 shares word lines with block n–2, which have a target voltage of about 8V. The word line voltages begin to ramp up at t5 (see plot 1412) and reach their target at t6. Thus, the difference between the memory cell channel voltage (e.g., 18V) and the word line voltage (8V) will not erase the memory cells in the unselected block n–3.

FIG. 14 also depicts the voltages applied to the drain side select lines (SGD0, SGD1, SGD2, SGD3). As noted in step 806 of FIG. 8, a set of voltages are applied to the drain side select gates in the unselected block. FIG. 14 shows that the times for ramping up these voltages are staggered (see plots 1404, 1406, 1408, 1410). In an embodiment, the start times are staggered such that each voltage in the set reaches its target voltage at about the same time (e.g., t7). Moreover, staggering the start times may prevent gate induced drain leakage (GIDL) generation, which reduces current consumption during ramp-up. The highest voltage is applied to SGD3 with progressively lower voltages being applied to SGD2, SGD1, and SGD0. Thus, the highest voltage is applied to the drain select transistor that is nearest the bit line and the lowest voltage is applied to the drain select transistor that is nearest the memory cells. These voltages may range between the erase voltage (Vera) and the SL voltage. As one example, the voltages are about 22V, 21V, 20V, and 18V corresponding to SGD3, SGD2, SGD1, and SGD0 respectively. In this example, the voltage on SGD0 is about the same as the voltage on the SL. This set of voltages will not result in GIDL generation in the drain side select transistors. Therefore, current consumption is very low. Moreover, the erase voltage (Vera) that is on the bit lines will not be passed to the channels of the memory cells in the unselected block n–3.

Figure 15:
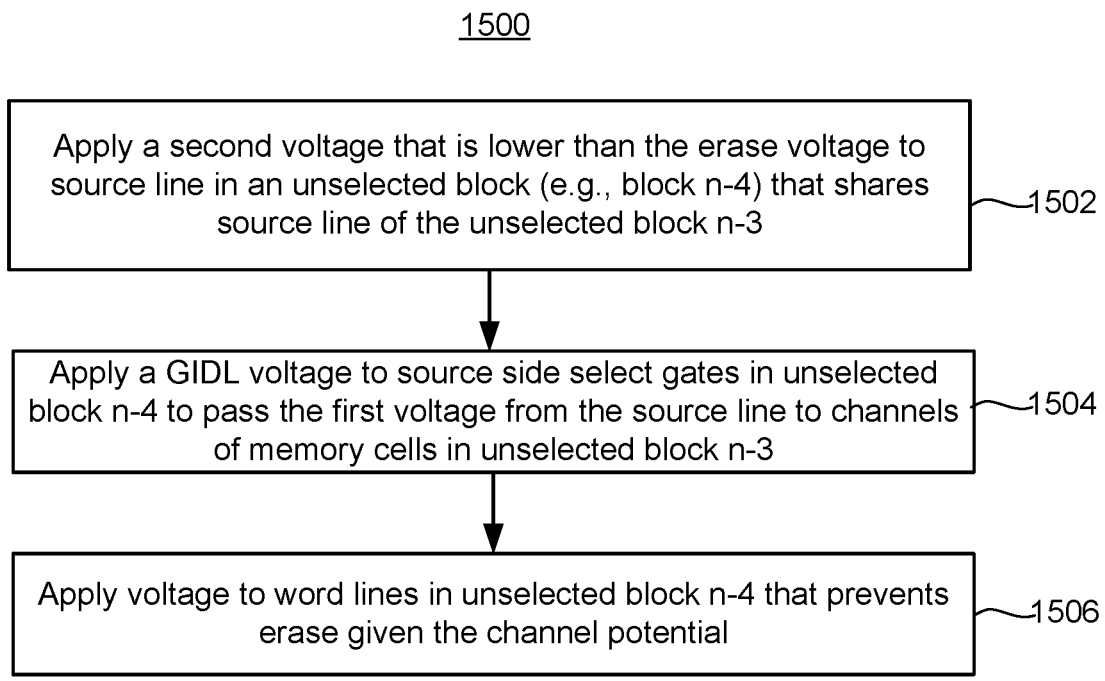
FIG. 15 is a flowchart of one embodiment of a process of raising the channel potential of memory cells in an unselected group.

FIG. 15 is a flowchart of one embodiment of a process 1500 of raising the channel potential of memory cells in an unselected group. The process 1500 provides further details of one embodiment of step 804 in FIG. 8. In process 1500 the unselected memory cells do not share word lines with the memory cells that were selected for erase. However, the unselected memory cells share a source lines line block n–3. An example will be discussed in which the selected memory cells are in Block n and the unselected memory cells of process 1500 is in Block n–4 (see FIG. 4D); however, process 1500 is not limited to this example. Process 1500 may be performed in combination with process 600, process 900, process 1100 and/or process 1200. However, process 1100 is not required to be performed in combination with process 600, process 900, process 1100 and/or process 1200.

Step 1502 includes applying the second voltage that is lower than the first erase voltage to the source line in the unselected block n–4. This may result from applying the second voltage to the source line in the unselected block n–3 due to the sharing of the source line between these two block. For example, the second voltage is applied to SL 467a. In an embodiment, the second voltage is about 18V. Thus, in an embodiment, the second voltage applied to SL 476a is greater than the first voltage applied to SL 476b, but less than the erase voltage (Vera) applied to SL 476c.

Step 1504 includes applying a GIDL voltage to gates of source side select gates in the unselected block n–4 to pass the second voltage from the source line to channels of unselected memory cells in the unselected block n–4. In an embodiment, the GIDL voltage is about 8V, given that the second voltage is about 18V. Therefore, the drain to gate voltage is about 10V, which is sufficient for GIDL current generation.

Step 1506 includes applying a voltage to the word lines in the unselected block n–4 that prevents erase of unselected memory cells in block n–4 given the channel potential. With reference to FIG. 4D note that the word lines of Block n–4 are not shared with the word lines of Block n–3. Therefore, a higher voltage can be applied to the word lines in Block n–4. In one embodiment, the voltage is about 15V. Therefore, the voltage difference between the channels and control gates of the unselected memory cells (18V−15V=3V) is not sufficient to erase the unselected memory cells. Therefore, erase disturb is prevented in block n–4. Process 1500 thereby results in the second voltage passing to the channels of unselected memory cells in the unselected block n–3.

Figure 16:
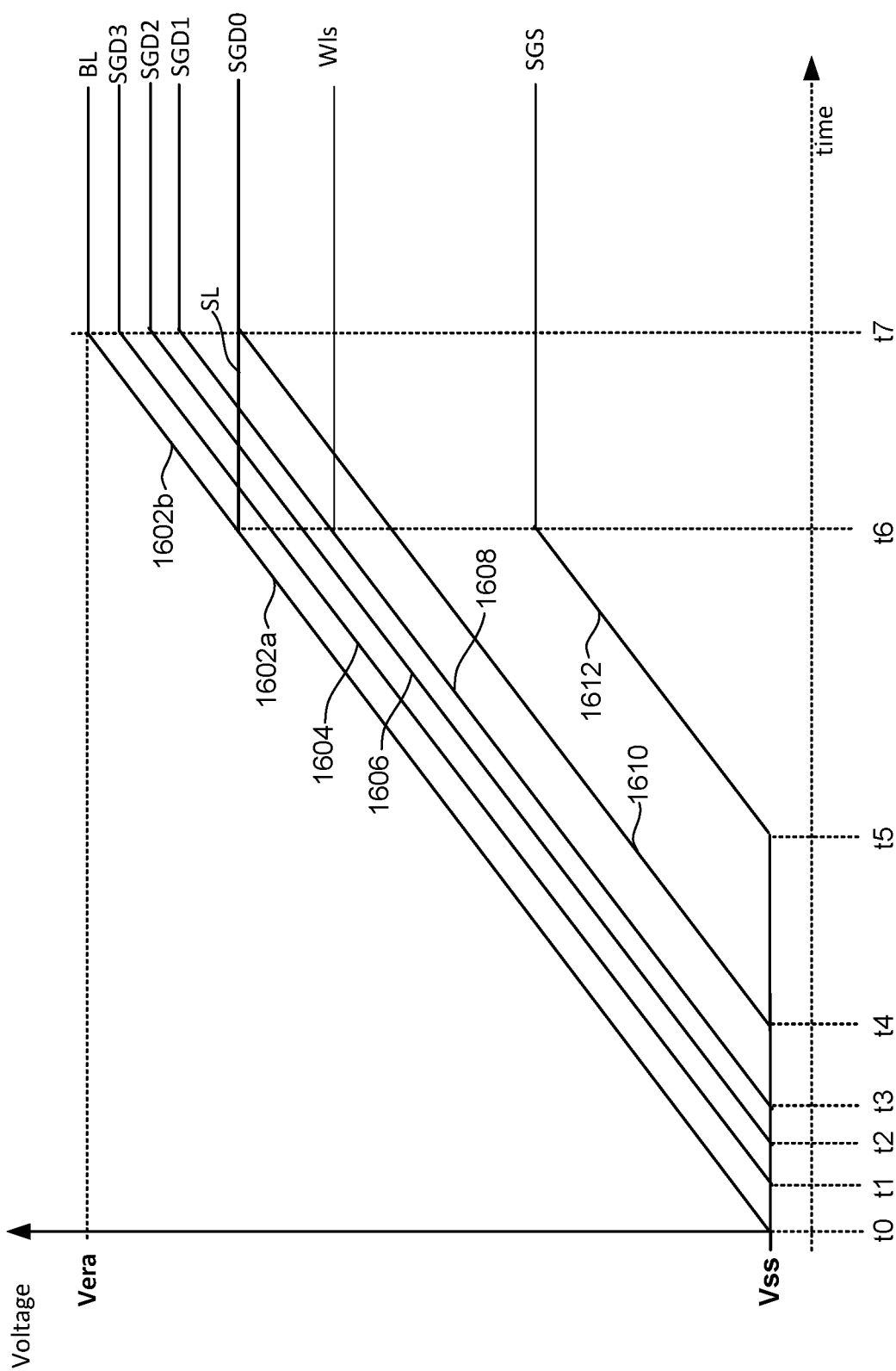
FIG. 16 shows timing of voltages applied when performing an embodiment of preventing erase disturb of the process of FIG. 15.

FIG. 16 shows timing of voltages applied when performing an embodiment of preventing erase disturb. In one embodiment, the voltages are applied when preventing erase disturb in unselected block n–4 (when block n is selected for erase). The voltages may be applied during process 1500, in combination with an embodiment of step 806. These voltages in FIG. 16 may be applied in combination with the voltages depicted in FIG. 7 being applied to the selected block n. These voltages in FIG. 16 may be applied in combination with the voltages depicted in FIG. 10 being applied to the block n–1. These voltages in FIG. 16 may be applied in combination with the voltages depicted in FIG. 13 being applied to the block n–2. These voltages in FIG. 16 may be applied in combination with the voltages depicted in FIG. 14 being applied to the block n–3.

At time t0, the voltage to the source line (SL) and the bit lines (BL) begins to ramp up from Vss towards their respective target voltages (plot 1602a). Note that block n–4 shares bit lines with block n. Therefore, the bit lines ramp up to Vera (plot 1602b). However, block n–4 does not share a source line or word lines with block n. However, block n–4 shares a source line with block n–3. The source line voltage ramps up to the target source line voltage of Block n–4 (e.g., 18V). The bit line voltage reaches Vera at t7 (which corresponds to t2 in FIG. 7). The source line voltage reaches its target voltage (e.g., 18V) at t6. The voltage on SGS begins to ramp up at t5 (see plot 1612) and reaches its target (e.g., 8V) at t6. In the foregoing example the difference between the SL and SGS is 10V which is a sufficient gate-drain difference to generate a GIDL current. As a result, the source line voltage (e.g., 18V) may be passed to the channels of the memory cells. The word line voltages begin to ramp up at t4 (see plot 1610) and reach their target at t6. The target word line voltage may be about 15V. Thus, the difference between the memory cell channel voltage (e.g., 18V) and the word line voltage (15V) will not erase the memory cells in the unselected block n–4.

FIG. 16 also depicts the voltages applied to the drain side select lines (SGD0, SGD1, SGD2, SGD3). As noted in step 806 of FIG. 8, a set of voltages are applied to the drain side select gates in the unselected block n–4. These may be similar to those for bock n–3. FIG. 16 shows that the times for ramping up these voltages are staggered (see plots 1604, 1606, 1608, 1610). In an embodiment, the start times are staggered such that each voltage in the set reaches its target voltage at about the same time (e.g., t7). Moreover, staggering the start times may prevent GIDL generation. The highest voltage is applied to SGD3 with progressively lower voltages being applied to D2, SGD1, and SGD0. Thus, the highest voltage is applied to the drain select transistor that is nearest the bit line and the lowest voltage is applied to the drain select transistor that is nearest the memory cells. These voltages may range between the erase voltage (Vera) and the SL voltage. As one example, the voltages are about 22V, 21V, 20V, and 18V corresponding to SGD3, SGD2, SGD1, and SGD0 respectively. In this example, the voltage on SGD0 is about the same as the voltage on the SL. This set of voltages will not result in GIDL generation in the drain side select transistors. Therefore, current consumption is very low. Moreover, the erase voltage (Vera) that is on the bit lines will not be passed to the channels of the memory cells in the unselected block n–4.

FIG. 17 shows a table 1700 pertaining to voltages of an embodiment of preventing erase disturb in NAND. The table 1700 shows voltages when memory cells in Block n are being erased. The table 1700 corresponds to an interleaved shared SL/WL structure such as depicted in FIG. 4D. FIG. 18 show a table 1800 of example voltages for one embodiment of preventing erase disturb in NAND. FIG. 18 shows example values for one embodiment.

As has been discussed Vera may be applied to the bit lines and to the source line of Block n. Therefore, Vera is also applied to the source line in block n+1 as well as the bit lines associated with block n+1. However, in an embodiment, the word lines, SGS, and SGD of block n+1 are all floated to prevent erase disturb. For block n+2 the source line, the word lines, SGS, and SGD are all floated to prevent erase disturb.

In an embodiment, the voltage Ve is a maximum tolerable voltage that can be applied to channel to control gate of memory cells while still preventing erase disturb. As one example, Ve may be 11V. The value Δ is the difference between gate and drain needed for GIDL generation. As one example, Δ may be 10V. The voltage Vod is the over drive voltage to enable PFET conduction. As one example, Vod may be about 4V.

In view of the foregoing, a first embodiment includes an apparatus comprising one or more control circuits configured to connect to a three-dimensional memory structure having NAND strings. Each NAND string comprises memory cells, a drain side select gate, and a source side select gate. The drain side select gate comprises a plurality of select transistors. The three-dimensional memory structure further comprises word lines connected to control gates of the memory cells, bit lines associated with the NAND strings, and source lines associated with the NAND strings. The one or more control circuits are configured to apply a first erase voltage to a first source line associated with a selected group of the NAND strings while applying a second erase voltage to selected bit lines associated with the selected group and while applying an erase enable voltage to selected word lines connected to selected memory cells on the selected group of the NAND strings to erase the selected memory cells. The one or more control circuits are configured to prevent erase of unselected memory cells while erasing the selected memory cells. The unselected memory cells reside on an unselected group of NAND strings that shares the selected bit lines. Prevent erase includes raising a potential of channels of the unselected memory cells to a first voltage of a second source line associated with the unselected group of NAND strings. The first voltage has a sufficiently low magnitude to not erase the unselected memory cells given a second voltage on word lines connected to the unselected memory cells. Prevent erase includes applying a set of voltages to the plurality of select transistors of the drain side select gates in the unselected group that prevents the second erase voltage from passing from the selected bit lines to the channels of the unselected memory cells. The voltages in the set of voltages decrease in a direction from the selected bit lines to the unselected memory cells.

In a second embodiment, in furtherance to the first embodiment, the one or more control circuits are further configured to begin to ramp up the set of voltages in an order that corresponds to the magnitudes of the voltages to prevent gate induced drain leakage (GIDL) generation.

In a third embodiment, in furtherance to the first or second embodiments, the voltages in the set of voltages have magnitudes between the second erase voltage and the first voltage.

In a fourth embodiment, in furtherance to any of the first to third embodiments, the set of voltages include a select voltage applied to the select transistor that is closest to the unselected memory cells. The select voltage has approximately the same magnitude as the first voltage.

In a fifth embodiment, in furtherance the any of the first to fourth embodiments, the unselected memory cells and the selected memory cells share the selected word lines. To raise the potential of the channels of the unselected memory cells to the first voltage the one or more control circuits are configured to: apply the first voltage to the second source line; and apply a third voltage to gates of the source side select gates in the unselected group of NAND strings that passes the first voltage from the second source line to the channels of the unselected memory cells to raise the channel potential of the unselected memory cells to the first voltage.

In a sixth embodiment, in furtherance the fifth embodiment, the one or more control circuits are further configured to begin to ramp up the third voltage at a delay after the first voltage to maintain a gate induced drain leakage (GIDL) current as the first voltage and the third voltage are ramping up.

In a seventh embodiment, in furtherance any of the first to sixth embodiments, the unselected memory cells and the selected memory cells do not share word lines. To raise the potential of channels of the unselected memory cells to the first voltage the one or more control circuits are configured to: apply the first voltage to the second source line; apply a third voltage to gates of the source side select gates in the unselected group of NAND strings that passes the first voltage from the second source line to the channels of the unselected memory cells to raise the channel potential of the unselected memory cells to the first voltage; and apply a fourth voltage to word lines connected to the unselected memory cells that prevents erase of the unselected memory cells given the channel potential of the unselected memory cells.

In an eighth embodiment, in furtherance to the seventh embodiment, the one or more control circuits are further configured to: begin to ramp up the third voltage at a delay after the first voltage to maintain a gate induced drain leakage (GIDL) current as the first voltage and the third voltage are ramping up; and begin to ramp up the fourth voltage at a delay after the first voltage to maintain a voltage difference between the first voltage and the fourth voltage as the first voltage and the fourth voltage are ramping up.

In a ninth embodiment, in furtherance to the seventh embodiment, the unselected memory cells on the unselected group of NAND strings are first unselected memory cells on a first group of unselected NAND strings that share the second source line with second unselected memory cells on a second group of unselected NAND strings. The second unselected memory cells share the selected word lines with the selected memory cells.

In a tenth embodiment, in furtherance to the seventh embodiment, the unselected memory cells on the unselected group of NAND strings are first unselected memory cells on a first group of unselected NAND strings that share word lines with second unselected memory cells on a second group of unselected NAND strings. The second unselected memory cells do not share the selected word lines with the selected memory cells.

In an eleventh embodiment, in furtherance to any of the first to tenth embodiments, the one or more control circuits are configured to apply a third voltage to control gates of the plurality of select transistors on the selected NAND strings to create a gate induced drain leakage (GIDL) current to pass the second erase voltage from the selected bit lines to the channels of the selected memory cells. The set of voltages applied to the select transistors of the drain side select gates in the unselected group of NAND strings prevent GIDL generation.

In a twelfth embodiment, in furtherance to any of the first to eleventh embodiments, the one or more control circuits are configured to apply a third voltage to control gates of the source side select gates on the unselected NAND strings to create a gate induced drain leakage (GIDL) current to pass the first voltage from the second source line to the channels of the unselected memory cells. The set of voltages applied to the select transistors of the drain side select gates in the unselected group of NAND strings prevent GIDL generation.

One embodiment includes a method for preventing erase disturb in a three-dimensional memory structure having blocks having NAND strings. Each NAND string has memory cells, a drain side select gate, and a source side select gate. The drain side select gate comprises a plurality of select transistors. Each block further comprises word lines connected to control gates of the memory cells. The method comprises applying a first erase voltage to a first source line associated with a selected block (block n) in the memory structure while applying a second erase voltage to selected bit lines and while applying an erase enable voltage to selected word lines of the selected block to erase selected memory cells in the selected block. The method comprises preventing erase disturb to unselected memory cells in an unselected block that shares the selected word lines with the selected block. Preventing erase disturb includes: applying a first voltage to a second source line of the unselected block; passing the first voltage from the second source line to channels of unselected memory cells in the unselected block, wherein the first voltage has a sufficiently low magnitude to not erase the unselected memory cells; and applying a set of voltages to the plurality of select transistors in drain side select gates of the unselected block that gradually decrease from the selected bit lines to the unselected memory cells of the unselected block. The set of voltages range between the second erase voltage and the first voltage and do not allow the second erase voltage to pass from the selected bit lines to the channels of the unselected memory cells in the unselected block.

One embodiment includes a non-volatile storage system comprising a three-dimensional memory structure having blocks having NAND strings. Each NAND string has memory cells, a drain side select gate, and a source side select gate. The drain side select gate comprises a plurality of select transistors. Each block further comprises word lines connected to control gates of the memory cells, bit lines associated with the blocks, and source lines associated with the blocks. Each bit line is associated with each block. The drain side select gate of a NAND string is configured to connect/disconnect its NAND string to the associated bit line. The non-volatile storage system further comprises one or more control circuits in communication with the three-dimensional memory structure. The one or more control circuits are configured to apply a first erase voltage to a first source line associated with a selected block while applying a second erase voltage to selected bit lines and while applying an erase enable voltage to selected word lines of the selected block to erase selected memory cells in the selected block. The one or more control circuits are configured to prevent erase of unselected memory cells in an unselected block that shares the selected word lines with the selected block. The unselected memory cells are connected to the selected word lines. The one or more control circuits apply a first voltage to a second source line associated with the unselected block; apply a second voltage to control gates of the source side select gates in the unselected block to pass the first voltage from the second source line to channels of the unselected memory cells in the unselected block, wherein the first voltage has a sufficiently low magnitude given to not erase the unselected memory cells; and apply a set of voltages to the plurality of select transistors of the drain side select gates in the unselected block that prevent the second erase voltage from passing from the selected bit lines to the channels of the unselected memory cells in the unselected block. Voltages in the set of voltages decrease in a direction from the selected bit lines to the unselected memory cells in the unselected block, wherein the voltages in the set of voltages have magnitudes between the second erase voltage and the first voltage.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to connect to a three-dimensional memory structure having NAND strings, wherein each NAND string comprises memory cells, a drain side select gate, and a source side select gate, wherein the drain side select gate comprises a plurality of select transistors, wherein the three-dimensional memory structure further comprises word lines connected to control gates of the memory cells, bit lines associated with the NAND strings, and source lines associated with the NAND strings, wherein the one or more control circuits are configured to:
- apply a first erase voltage to a first source line associated with a selected group of the NAND strings while applying a second erase voltage to selected bit lines associated with the selected group and while applying an erase enable voltage to selected word lines connected to selected memory cells on the selected group of the NAND strings to erase the selected memory cells; and
- prevent erase of unselected memory cells while erasing the selected memory cells, wherein the unselected memory cells reside on an unselected group of NAND strings that shares the selected bit lines, including:
  - raise a potential of channels of the unselected memory cells to a first voltage of a second source line associated with the unselected group of NAND strings, wherein the first voltage has a sufficiently low magnitude to not erase the unselected memory cells given a second voltage on the word lines connected to the unselected memory cells; and
  - apply a set of voltages to the plurality of select transistors of the drain side select gates in the unselected group that prevents the second erase voltage from passing from the selected bit lines to the channels of the unselected memory cells, wherein voltages in the set of voltages decrease in a direction from the selected bit lines to the unselected memory cells.

2. The apparatus of claim 1, wherein the one or more control circuits are further configured to:
begin to ramp up the set of voltages in an order that corresponds to the magnitudes of the voltages to prevent gate induced drain leakage (GIDL) generation.

3. The apparatus of claim 1, wherein the voltages in the set of voltages have magnitudes between the second erase voltage and the first voltage.

4. The apparatus of claim 1, wherein the set of voltages include a select voltage applied to the select transistor that is closest to the unselected memory cells, the select voltage has approximately the same magnitude as the first voltage.

5. The apparatus of claim 1, wherein:
the unselected memory cells and the selected memory cells share the selected word lines; and
to raise the potential of the channels of the unselected memory cells to the first voltage the one or more control circuits are configured to:
  apply the first voltage to the second source line; and
  apply a third voltage to gates of the source side select gates in the unselected group of NAND strings that passes the first voltage from the second source line to the channels of the unselected memory cells to raise the channel potential of the unselected memory cells to the first voltage.

6. The apparatus of claim 5, wherein the one or more control circuits are further configured to:
begin to ramp up the third voltage at a delay after the first voltage to maintain a gate induced drain leakage (GIDL) current as the first voltage and the third voltage are ramping up.

7. The apparatus of claim 1, wherein:
the unselected memory cells and the selected memory cells do not share word lines; and to raise the potential of channels of the unselected memory cells to the first voltage the one or more control circuits are configured to:
  apply the first voltage to the second source line;
  apply a third voltage to gates of the source side select gates in the unselected group of NAND strings that passes the first voltage from the second source line to the channels of the unselected memory cells to raise the channel potential of the unselected memory cells to the first voltage; and
  apply a fourth voltage to word lines connected to the unselected memory cells that prevents erase of the unselected memory cells given the channel potential of the unselected memory cells.

8. The apparatus of claim 7, wherein the one or more control circuits are further configured to:
begin to ramp up the third voltage at a delay after the first voltage to maintain a gate induced drain leakage (GIDL) current as the first voltage and the third voltage are ramping up; and
begin to ramp up the fourth voltage at a delay after the first voltage to maintain a voltage difference between the first voltage and the fourth voltage as the first voltage and the fourth voltage are ramping up.

9. The apparatus of claim 7, wherein:
the unselected memory cells on the unselected group of NAND strings are first unselected memory cells on a first group of unselected NAND strings that share the second source line with second unselected memory cells on a second group of unselected NAND strings; and
the second unselected memory cells share the selected word lines with the selected memory cells.

10. The apparatus of claim 7, wherein:
the unselected memory cells on the unselected group of NAND strings are first unselected memory cells on a first group of unselected NAND strings that share word lines with second unselected memory cells on a second group of unselected NAND strings; and
the second unselected memory cells do not share the selected word lines with the selected memory cells.

11. The apparatus of claim 1, wherein:
the one or more control circuits are configured to apply a third voltage to control gates of the plurality of select transistors on the selected NAND strings to create a gate induced drain leakage (GIDL) current to pass the second erase voltage from the selected bit lines to the channels of the selected memory cells; and
the set of voltages applied to the select transistors of the drain side select gates in the unselected group of NAND strings prevent GIDL generation.

12. The apparatus of claim 1, wherein:
the one or more control circuits are configured to apply a third voltage to control gates of the source side select gates on the unselected NAND strings to create a gate induced drain leakage (GIDL) current to pass the first voltage from the second source line to the channels of the unselected memory cells; and
the set of voltages applied to the select transistors of the drain side select gates in the unselected group of NAND strings prevent GIDL generation.

13. A method for preventing erase disturb in a three-dimensional memory structure having blocks having NAND strings, wherein each NAND string has memory cells, a drain side select gate, and a source side select gate, wherein the drain side select gate comprises a plurality of select transistors, wherein each block further comprises word lines connected to control gates of the memory cells, the method comprising:
- applying a first erase voltage to a first source line associated with a selected block (block n) in the memory structure while applying a second erase voltage to selected bit lines and while applying an erase enable voltage to selected word lines of the selected block to erase selected memory cells in the selected block; and
- preventing erase disturb to unselected memory cells in an unselected block that shares the selected word lines with the selected block, including:
  - applying a first voltage to a second source line of the unselected block;
  - passing the first voltage from the second source line to channels of unselected memory cells in the unselected block, wherein the first voltage has a sufficiently low magnitude to not erase the unselected memory cells; and
  - applying a set of voltages to the plurality of select transistors in drain side select gates of the unselected block that gradually decrease from the selected bit lines to the unselected memory cells of the unselected block, wherein the set of voltages range between the second erase voltage and the first voltage and do not allow the second erase voltage to pass from the selected bit lines to the channels of the unselected memory cells in the unselected block.

14. The method of claim 13, wherein:
- passing the first voltage from the second source line to the channels of the unselected memory cells in the unselected block comprises applying a second voltage to control gates of the source side select gates in the unselected block that generates a gate induced drain leakage (GIDL) current to pass the first voltage from the second source line to the channels of the unselected memory cells in the unselected block; and
- applying the set of voltages to the plurality of select transistors in the drain side select gates of the unselected block comprises preventing a GIDL current in the plurality of select transistors during both ramp-up of the set of voltages and when the set of voltages are at a target level.

15. The method of claim 13, further comprising:
- passing the first voltage from the second source line to channels of second unselected memory cells in a second unselected block that shares the second source line with the unselected block;
- applying a second voltage to word lines in the second unselected block that has a magnitude between the erase enable voltage and the second erase voltage, wherein the first voltage has a sufficiently low magnitude to not erase the second unselected memory cells in the second unselected block given the second voltage applied to the word lines in the second unselected block; and
- applying the set of voltages to the plurality of select transistors in drain side select gates of the second unselected block, wherein the set of voltages range do not allow the second erase voltage to pass from the selected bit lines to the channels in the second unselected memory cells in the second unselected block and do not generate a gate induced drain leakage (GIDL) current.

16. A non-volatile storage system, the system comprising:
- a three-dimensional memory structure having blocks having NAND strings, each NAND string having memory cells, a drain side select gate, and a source side select gate, wherein the drain side select gate comprises a plurality of select transistors, wherein each block further comprises word lines connected to control gates of the memory cells, bit lines associated with the blocks, and source lines associated with the blocks, wherein each bit line is associated with each block, wherein the drain side select gate of a NAND string is configured to connect/disconnect its NAND string to the associated bit line; and
- one or more control circuits in communication with the three-dimensional memory structure, wherein the one or more control circuits are configured to:
  - apply a first erase voltage to a first source line associated with a selected block while applying a second erase voltage to selected bit lines and while applying an erase enable voltage to selected word lines of the selected block to erase selected memory cells in the selected block;
  - prevent erase of unselected memory cells in an unselected block, wherein the unselected block and the selected block share the selected word lines, wherein the unselected memory cells are connected to the selected word lines, including:
    - apply a first voltage to a second source line associated with the unselected block;
    - apply a second voltage to control gates of the source side select gates in the unselected block to pass the first voltage from the second source line to channels of the unselected memory cells in the unselected block, wherein the first voltage has a sufficiently low magnitude given to not erase the unselected memory cells; and
    - apply a set of voltages to the plurality of select transistors of the drain side select gates in the unselected block that prevent the second erase voltage from passing from the selected bit lines to the channels of the unselected memory cells in the unselected block, wherein voltages in the set of voltages decrease in a direction from the selected bit lines to the unselected memory cells in the unselected block, wherein the voltages in the set of voltages have magnitudes between the second erase voltage and the first voltage.

17. The non-volatile storage system of claim 16, wherein the one or more control circuits are further configured to:
- begin to ramp up the set of voltages in an order that corresponds to the magnitudes of the voltages to prevent gate induced drain leakage (GIDL) generation in the plurality of select transistors.

18. The non-volatile storage system of claim 16, wherein:
- applying the first voltage and the second voltage generates a gate induced drain leakage (GIDL) current in the source side select gates; and
- the one or more control circuits are configured to begin to ramp up the second voltage at a delay after the first voltage such that a voltage difference between the first voltage and the second voltage continues to create the GIDL current when ramping the first and the second voltages.

19. The non-volatile storage system of claim 16, wherein:
- the unselected block is a first unselected block;
- the first unselected block shares the second source line with a second unselected block;
- the one or more control circuits are further configured to prevent erase of unselected memory cells in the second unselected block, including:

apply the second voltage to control gates of the source side select gates in the second unselected block to pass the first voltage from the second source line to the channels of unselected memory cells in the second unselected block;

apply a third voltage to word lines in the second unselected block that prevents erase of the unselected memory cells in the second unselected block, wherein the third voltage has a magnitude greater than the erase enable voltage; and apply the set of voltages to the plurality of select transistors of the drain side select gates in the second unselected block.

20. The non-volatile storage system of claim 19, wherein:

the second unselected block shares word lines with a third unselected block;

the one or more control circuits are further configured to prevent erase of unselected memory cells in the third unselected block, including:

apply a fourth voltage to a third source line of the third unselected block;

apply a fifth voltage to control gates of the source side select gates in the third unselected block to create GIDL current that passes the fourth voltage from the third source line to the channels of the unselected memory cells in the third unselected block, wherein the fifth voltage has a sufficiently low magnitude to not erase the unselected memory cells in the third unselected block given the third voltage applied to the word lines in the third unselected block; and apply a second set of voltages to the plurality of select transistors of the drain side select gates in the third unselected block that prevents the second erase voltage from passing from the selected bit lines to the channels of the unselected memory cells in the third unselected block, wherein voltages in the second set of voltages decrease in a direction from the selected bit lines to the unselected memory cells in the third unselected block, wherein the voltages in the second set of voltages are between the second erase voltage and the fourth voltage.

* * * * *